United States Patent [19]
Kubota

[11] Patent Number: 5,757,044
[45] Date of Patent: May 26, 1998

[54] ELECTRICALLY ERASABLE AND PROGRAMMABLE READ ONLY MEMORY CELL WITH SPLIT FLOATING GATE FOR PREVENTING CELL FROM OVER-ERASE

[75] Inventor: Taishi Kubota, Tokyo, Japan

[73] Assignee: NEC Corporation, Tokyo, Japan

[21] Appl. No.: 548,523

[22] Filed: Oct. 26, 1995

[30] Foreign Application Priority Data

Oct. 28, 1994 [JP] Japan ................................. 6-265559

[51] Int. Cl.$^6$ ................................. H01L 29/788
[52] U.S. Cl. ..................... 257/316; 257/317; 257/321
[58] Field of Search ............................. 257/315, 316, 257/317, 321

[56] References Cited

U.S. PATENT DOCUMENTS 4,380,057  4/1983  Kotecha et al. .
4,590,503  5/1986  Harari et al. .
5,357,134  10/1994  Shimoji ................................. 257/325
5,511,036  4/1996  Farb et al. ............................ 365/185.1

Primary Examiner—Ngân V. Ngô
Attorney, Agent, or Firm—Foley & Lardner

[57] ABSTRACT

A floating gate type field effect transistor has a plurality of floating gate sub-electrodes on a lower gate oxide layer electrically isolated from one another; even if one of the floating gate sub-electrodes changes a part of a channel region thereunder to depletion state due to an over-erase, the over-erase does not affect the function of the floating gate type field effect transistor, because another sub-electrode transfers and cuts off channel current depending upon the amount of electrons accumulated therein.

10 Claims, 21 Drawing Sheets

ELECTRICALLY ERASABLE AND PROGRAMMABLE READ ONLY MEMORY CELL WITH SPLIT FLOATING GATE FOR PREVENTING CELL FROM OVER-ERASE

FIELD OF THE INVENTION

This invention relates to an electrically erasable and programmable read only memory device and, more particularly, to an electrically erasable and programmable read only memory device having stacked type floating gate field effect transistors changing thresholds through an injection of hot carriers through the Fowler-Nordheim tunneling phenomenon.

DESCRIPTION OF THE RELATED ART

FIGS. 1 and 2 illustrate a typical example of the stacked type floating gate field effect transistor incorporated in the prior art electrically erasable and programmable read only memory device. The stacked type floating gate field effect transistor serves as a memory cell for storing a data bit.

The electrically erasable and programmable read only memory device is fabricated on a p-type silicon substrate 1, and a field oxide layer 2 defines an active area for a stacked type floating gate field effect transistor 3. N-type dopant impurity is selectively introduced into the active area so as to form a heavily doped n-type source region 3a and a heavily doped n-type drain region 3b on both sides of a channel region 3c.

A thin gate oxide layer 3d covers the channel region 3c, and is thin enough to pass Fowler-Nordheim tunneling current. A floating gate electrode 3e is formed on the thin gate oxide layer 3d, and is overlain by an inter-gate insulating layer 3f. A control gate electrode 3g is formed on the inter-gate insulating layer 3f, and the thin gate oxide layer 3d, the floating gate 3e, the inter-gate insulating layer 3f and the control gate 3g as a whole constitute a stacked gate structure. The heavily doped n-type source region 3a and the heavily doped n-type drain region 3b are self-aligned with the control gate 3g.

The active areas are arranged in a matrix, and, accordingly, the stacked type floating gate field effect transistors form a NOR-type memory cell array.

The control gate electrode 3g is grouped with the control gate electrodes 3g of other stacked type floating gate field effect transistors in the same row, and the control gate electrodes 3g form a word line WL. The heavily doped n-type source region 3a is shared with other stacked type floating gate field effect transistors associated with the word line WL.

Another stacked type floating gate field effect transistor is assigned to an active area on the right side of the stacked type floating gate field effect transistor 3, and another word line and another heavily doped n-type source region are also shared among other stacked type floating gate field effect transistors. The heavily doped n-type drain region 3b is shared between the stacked type floating gate field effect transistor 3 and the other stacked type floating gate field effect transistor on the right side thereof, and is connected to a digit line (not shown). The digit line (not shown) extends in perpendicular to the word line WL on a different level.

The threshold of the stacked type floating gate field effect transistor is variable depending upon the amount of electrons accumulated in the floating gate electrode 3e. The high threshold and the low threshold correspond to the write-in state and the erased state.

In order to change the stacked type floating gate field effect transistor to the high threshold, a write-in gate voltage of 12 volts higher than the positive power voltage of 5 volts is applied to the control gate electrode 3g, and a write-in drain voltage of 7 volts is supplied through the digit line to the heavily doped n-type drain region 3b. The p-type silicon substrate 1 and the heavily doped n-type source region 3a are grounded. The reversely biased heavily doped n-type drain region 3b generates hot electrons, and the hot electrons are attracted toward the floating gate electrode 3e due to the strong electric field created by the write-in gate voltage applied to the control gate electrode 3g. The hot electrons are accumulated in the floating gate electrode 3e, and the accumulated electrons affects the channel region 3c. The threshold is determined by the bias conditions and the time in the range of proportional distribution, and is elevated to 7 volts, by way of example. The change to the high threshold is carried out for each of the stacked type floating gate field effect transistors.

The change to the low threshold is carried out through a channel erase or a block erase. The accumulated electrons are evacuated from the floating gate electrodes 3g through the thin gate oxide layer 3d to the source regions 3a in the block erase. However, the block erase gives stress to the thin gate oxide layer 3d, and the channel erase is major in the flash type electrically erasable and programmable read only memory device.

The channel erase is, by way of example, carried out for every 4 kilo-bits, and the accumulated electrons are evacuated through the thin gate oxide layer 3d to the channel regions 3c as Fowler-Nordheim tunneling current. Potential difference larger than the power potential difference is applied between the control gate electrodes 3g and the channel regions 3c. If $-15$ volts is applied to the control gate electrodes 3g, the p-type silicon substrate 1 is biased with $+3$ volts, and the large potential difference of 18 volts is applied between the control gate electrodes 3g and the channel regions 3c. Then, the accumulated electrons are evacuated through the thin gate oxide layer 3d into the p-type silicon substrate 1, and the thresholds are decreased to 2 volts lower than the positive power voltage.

The flash type electrically erasable and programmable read only memory device encounters a problem in over-erase. Although it is said that point defects of the thin gate oxide layer 3d are causative of the over-erase, the over-erase has not been clearly understood.

If the electrons are excessively evacuated from the floating gate electrode 3e, over-erase takes place in the floating gate field effect transistor. Even if the electrons are excessively evacuated, the floating gate field effect transistor is possibly changed to the high threshold through the injection of electrons in so far as the threshold in the over-erase is higher than the ground voltage level. However, when the threshold in the over-erase becomes a negative value, the floating gate type field effect transistor enters into the depletion mode, and is hardly changed to the high threshold level through the usual electron injection.

If the other floating gate field effect transistors share the digit line with the over-erased floating gate field effect transistor, these floating gate field effect transistors form a NOR memory block, and the other floating gate field effect transistors can not be changed to the write-in state, because the over-erased floating gate field effect transistor does not allow the drain regions of the other floating gate field effect transistors to reach the write-in drain voltage. This undesirable phenomenon is called the "digit line defect".

The present inventor confirmed the over-erase. First, the present inventor fabricated the stacked type floating gate field effect transistors shown in FIGS. 1 and 2 as follows.

The p-type silicon substrate 1 was (100) surface orientation, and the surface portion of the p-type silicon substrate 1 was doped at $1 \times 10^{17}$ cm$^{-3}$. The field oxide layer 2 was 0.6 micron thick. The thin gate oxide layer 3d was grown through a thermal oxidation, and was 10 nanometers thick.

The floating gate electrode 3e was formed of polysilicon doped with n-type dopant impurity at $1 \times 10^{19}$ cm$^{-3}$, and was 150 nanometers in thickness. The floating gate electrode 3e extended from the thin gate oxide layer 3d to the thick field oxide layer 2, and each side portion of the floating gate electrode 3e overlapped the thick field oxide layer 2 by 0.3 micron.

The inter-gate insulating layer 3f was a laminated structure of a lower silicon oxide layer, a silicon nitride layer and an upper silicon oxide layer. The silicon oxide layers were grown through a high temperature vapor phase oxide deposition, and the silicon nitride layer was grown through a low pressure chemical vapor deposition. The lower silicon oxide layer and the upper silicon oxide layer were 7 nanometers thick and 4 nanometers thick, and the silicon nitride layer was 9 nanometers thick.

The control gate electrode 3g was 0.8 micron by 0.8 micron, and was a lamination of a heavily doped n-type polysilicon layer of 150 nanometers thick and a tungsten silicide layer of 200 nanometers thick.

The heavily doped n-type source region 3a formed a p-n junction around 0.4 micron deep, and was overlapped with the control gate electrode 3g by 0.25 micron. The heavily doped n-type drain region 3b formed a p-n junction around 0.15 micron in depth, and was overlapped with the control gate electrode 3g by 0.1 micron. The reason why the heavily doped n-type source region 3a was deeper than the heavily doped n-type drain region 3b was that the source region 3a was expected to be low resistance.

Using the stacked type floating gate field effect transistors, the present inventor measured the thresholds, and analyzed the write-in/erase characteristics. The bias conditions for the write-in were 12 volts to the control gate electrodes 3g, 7 volts to the heavily doped n-type drain regions 3b and the ground voltage to the heavily doped n-type source regions 3a and the p-type silicon substrate 1, and were maintained for 20 micro-seconds.

On the other hand, the bias conditions for the erase were −15 volts to the control gate electrodes 3g and 3 volts to the p-type silicon substrate 1. The erase was concurrently carried out for 4000 floating gate field effect transistors, and the bias conditions were maintained for 1 second.

The thresholds were plotted in FIGS. 3 and 4. The excellent floating gate field effect transistors traced plots PL1 (indicated by a dotted line), and the defective floating gate field effect transistors traced plots PL2 (indicated by a solid line) before the over-erase took place. The excellent floating gate field effect transistors decreased the threshold along plots PL3 (see FIG. 4) through the evacuation of the accumulated electrons, and, thereafter, the thresholds traced plots PL1 again through the injection of electrons. Therefore, the excellent floating gate field effect transistors changed the threshold between 2 volts and 7 volts.

However, after the over-erase took place in the defective floating gate field effect transistors as indicated by plots PL4 of FIG. 4, the defective floating gate field effect transistors did not change the threshold as indicated by plots PL5 of FIG. 3.

After the entry into the over-erase, the excellent floating gate field effect transistors sharing the digit line with the defective floating gate field effect transistors did not change the thresholds, and the digit line defect took place.

A defective floating gate field effect transistor decreased the threshold between 2 volts and zero through the evacuation of the accumulated electrons, and the threshold was increased over the read-out gate voltage through the next electron injection. However, if the injection and the evacuation were repeated, both low and high thresholds were gradually lowered, and the digit line defect also took place. The defective floating gate field effect transistor in the over-erase was further erased through the evacuation, and the threshold reached −2 volts, determined by the bias conditions in the erasing operation.

Thus, the over-erase was a fatal blow to the flash type electrically erasable and programmable read only memory device, and only the use of redundant memory cells would rescue the defective product due to the over-erase from the rejection.

SUMMARY OF THE INVENTION

It is therefore an important object of the present invention to provide an electrically erasable and programmable read only memory cell which is prevented from over-erase.

The present inventor contemplated the problem, and noticed that the thin gate oxide layer was partially damaged.

To accomplish the object, the present invention proposes to cause a plurality of floating gate sub-electrodes to control respective sub-regions of a channel region.

In accordance with the present invention, there is provided a floating gate type field effect transistor fabricated on a semiconductor layer of a first conductivity type, comprising: a source region having a second conductivity type opposite to the first conductivity type, and formed in a surface portion of the semiconductor layer; a drain region of the second conductivity type formed in another surface portion of the semiconductor layer spaced from the surface portion; a channel region provided in yet another surface portion of the semiconductor layer between the source region and the drain region; a first gate insulating layer covering at least the channel region, and having a thickness allowing a tunneling current to pass therethrough; a floating gate electrode having a plurality of sub-electrodes formed on the first gate insulating layer at intervals; a second gate insulating layer covering upper surfaces of the plurality of sub-electrodes, and filling gaps between the plurality of sub-electrodes for isolating the plurality of sub-electrodes from one another; and a control gate electrode formed on the second gate insulating layer, and creating an electric field across the first gate insulating layer so as to cause the tunneling current to flow through the first gate insulating layer and check the threshold whether higher or lower than a read-out gate voltage applied to the control gate electrode.

The plurality of sub-electrodes may respectively form a plurality of floating gate sub-transistors different in threshold from one another together with the first and second gate insulating layers, the control gate electrode and a plurality of channel sub-regions beneath the sub-electrodes.

The plurality of sub-electrodes may be formed from silicon crystal grains.

BRIEF DESCRIPTION OF THE DRAWINGS

The features and advantages of the electrically erasable and programmable read only memory device according to the present invention will be more clearly understood from the following description taken in conjunction with the accompanying drawings in which:

FIG. 3 is a graph showing the increase of threshold through the write-in;

DESCRIPTION OF THE PREFERRED EMBODIMENTS

First Embodiment

Figure 1:
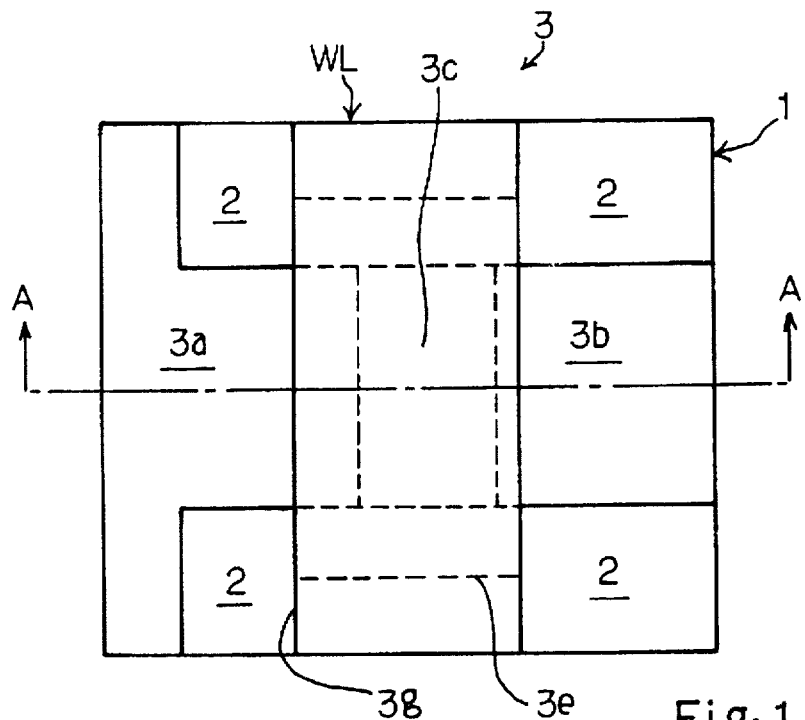
FIG. 1 is a plan view showing the layout of the prior art stacked type floating gate field effect transistor.
Figure 2:
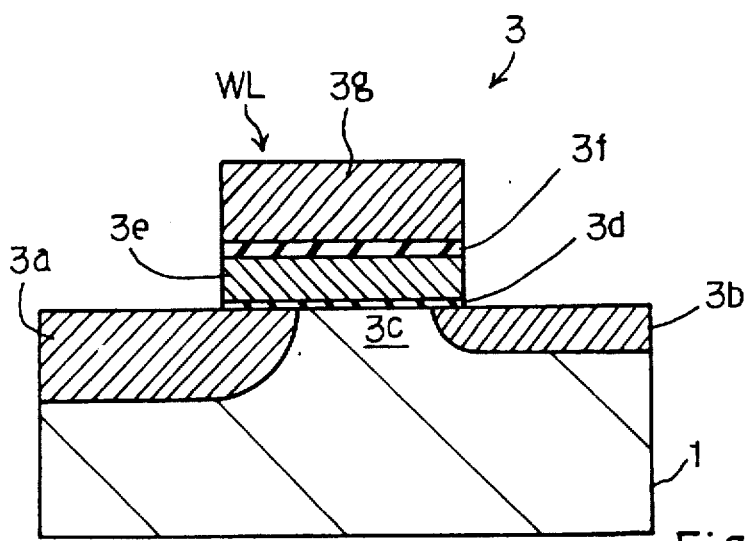
FIG. 2 is a cross sectional view taken along line A—A of FIG. 1 and showing the structure of the stacked type floating gate field effect transistor.
Figure 3:
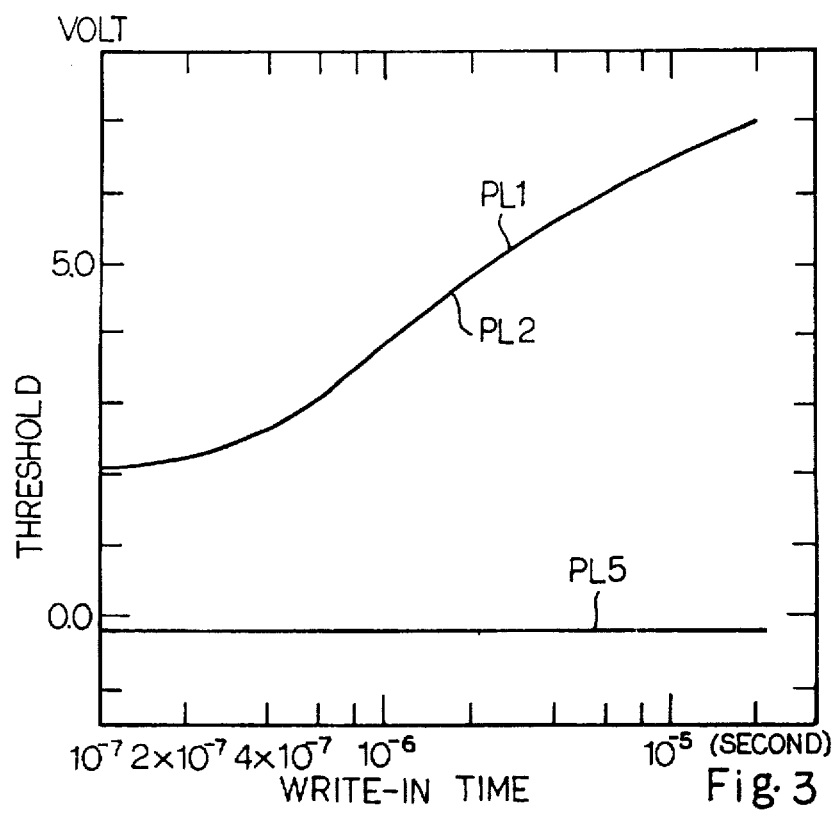
Figure 4:
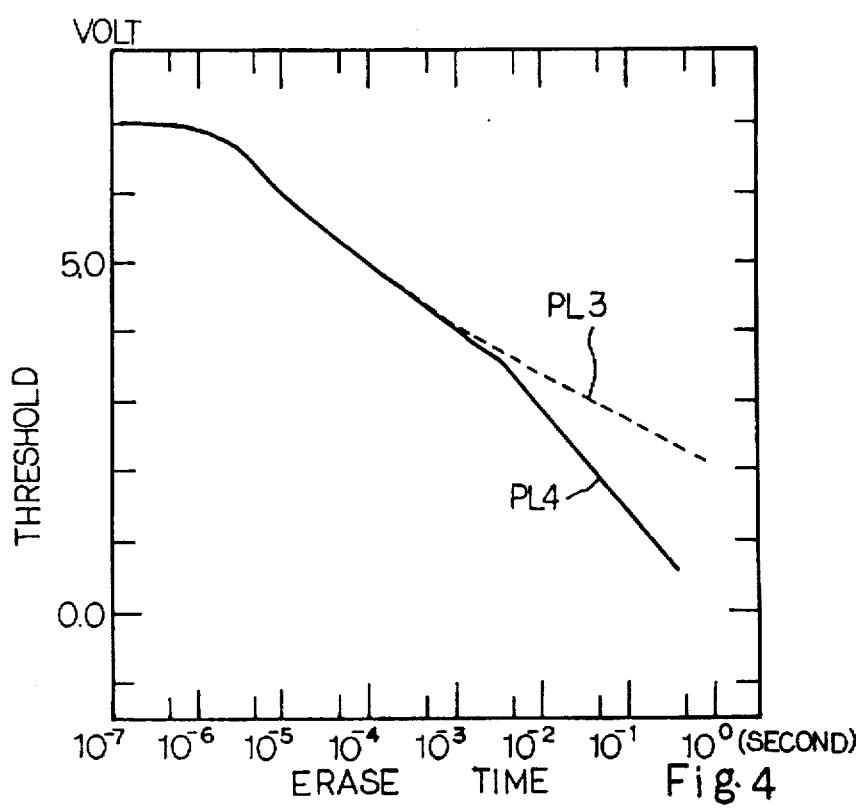
FIG. 4 is a graph showing the decrease of threshold through the erase.
Figure 5:
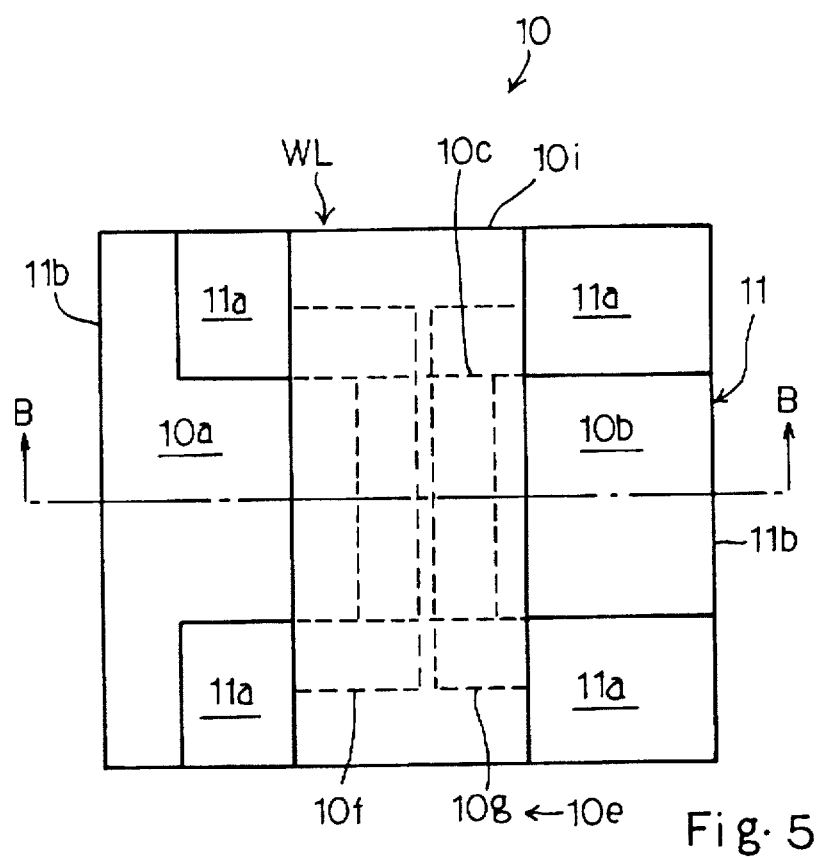
FIG. 5 is a plan view showing the layout of a floating gate field effect transistor embodying the present invention.
Figure 6:
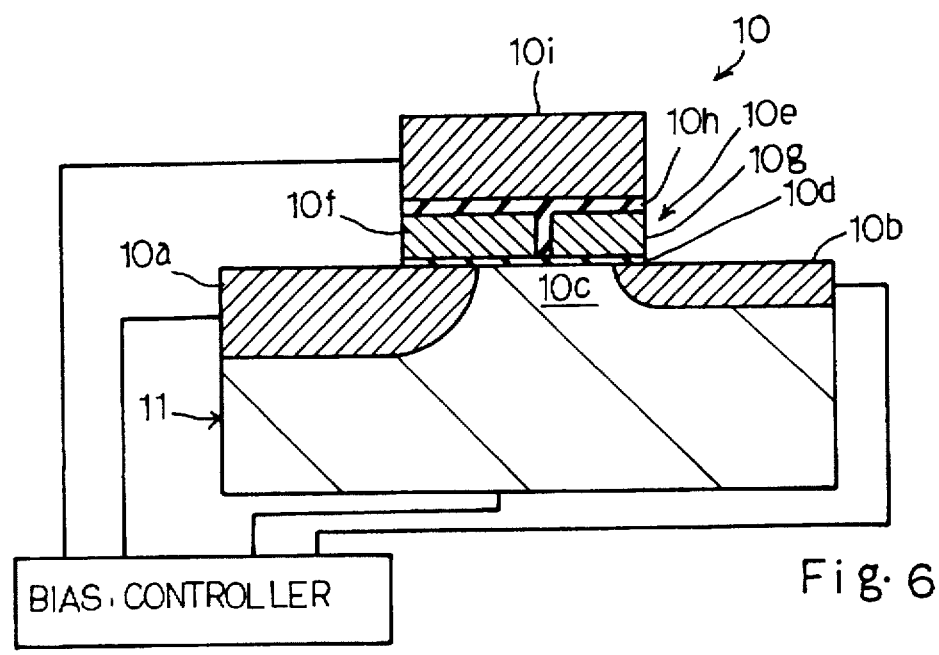
FIG. 6 is a cross sectional view taken along line B—B of FIG. 5 and showing the structure of the floating gate field effect transistor.

Referring first to FIGS. 5 and 6 of the drawings, a floating gate field effect transistor 10 embodying the present invention is fabricated on a p-type silicon substrate 11, and the p-type silicon substrate 11 serves as a semiconductor layer. The p-type silicon substrate 11 is (100) surface oriented, and the surface dopant concentration is of the order of $2\times10^{17}$ $cm^{-3}$. Though not shown in FIGS. 5 and 6, the floating gate field effect transistor 10 forms a NOR type memory block together with other floating gate field effect transistors similar in structure thereto, and the floating gate field effect transistors store data bits, respectively. A plurality of NOR type memory blocks are incorporated in a flash type electrically erasable and programmable read only memory device, and form a memory cell array. An addressing system, a sense amplifier unit, a write-in unit, a data buffer unit and an erasing system assist the memory cell array in accessing and rewriting data bits. However, these systems and units are not described hereinbelow, because they are less important for understanding the present invention.

The active device areas assigned to the floating gate field effect transistors are arranged in a matrix, and are repeated two-dimensionally or in longitudinal and lateral directions of FIG. 5 at intervals. Repetition in the longitudinal direction is hereinbelow referred to as a row, and repetition in the lateral direction is referred to a column.

The p-type silicon substrate 11 is selectively oxidized so as to form a thick field oxide layer 11a, and the thick field oxide layer 11a defines an active device area 11b assigned to the floating gate field effect transistor 10. The thick field oxide layer 11a is as thick as 0.6 micron. The other floating gate field effect transistors are respectively assigned other active areas.

The active area 11b is partially doped with n-type dopant impurity, and serves as a heavily doped n-type source region 10a and a heavily doped n-type drain region 10b. A channel region 10c is provided between the heavily doped n-type source region 10a and the heavily doped n-type drain region 10b.

The heavily doped n-type drain region 10b and the p-type silicon substrate 11 form a p-n junction at 0.15 micron in depth, and is overlapped with the control gate electrode 10i by 0.1 micron. The floating gate field effect transistor 10 shares the heavily doped n-type drain region 10b with the floating gate field effect transistor in the right-side row. Though not shown in FIGS. 5 and 6, a digit line is connected to the heavily doped n-type drain region 10b, and extends over the floating gate field effect transistors in the lateral direction of FIG. 5.

On the other hand, the heavily doped n-type source region 10a forms a p-n junction together with the p-type silicon substrate 11 at 0.4 micron in depth, and extends under the control gate electrode 10i by 0.25 micron. The heavily doped n-type source region 10a is deeper than the heavily doped n-type drain region 10b, and, accordingly, is lower in resistance than the heavily doped n-type drain region 10b. The heavily doped n-type source region 10a extends in the longitudinal direction of FIG. 5, and is grouped with the heavily doped n-type source regions of the other floating gate field effect transistors in the same row.

A thin gate oxide layer 10d covers the channel region 10c, a part of the heavily doped n-type source region 10a and a part of the heavily doped n-type drain region 10b. The thin gate oxide layer 10d is grown through a thermal oxidation, and is of the order of 10 nanometers thick. The thin gate oxide layer 10d is so thin that Fowler-Nordheim tunneling current can flow through the thin gate oxide layer 10d.

A floating gate electrode 10e is provided on the thin gate oxide layer 10d, and is formed of heavily doped n-type polysilicon. The dopant concentration is of the order of $1 \times 10^{19}$ cm$^{-3}$, and the thickness of the floating gate electrode 10e is about 150 nanometers. Two floating sub-electrodes 10f and 10g form in combination the floating gate electrode 10e, and are spaced from one another by 60 nanometers. The heavily doped n-type source region 10a is partially overlapped with the floating sub-electrode 10f by 0.25 micron, and the heavily doped n-type drain region 10b is partially overlapped with the other floating sub-electrode 10g by 0.1 micron. The floating sub-electrode 10f and the floating sub-electrode 10g are respectively spaced from the heavily doped n-type drain region 10b and the heavily doped n-type source region by 0.25 micron. The gap between the floating sub-electrodes 10f and 10g extends in the direction of the channel width or in a perpendicular direction to channel current flowing from the drain region 10b to the source region 10a. The floating sub-electrodes 10f and 10g extend on the thick field oxide layer 11a by 0.3 micron.

An inter-gate insulating layer 10h not only covers the upper surfaces of the floating sub-electrodes 10f/10g but also fills the gap between the floating sub-electrodes 10f and 10g. The inter-gate insulating layer 10h has a multi-layer structure, and a silicon oxide film of 7 nanometers thick, a silicon nitride film of 9 nanometers thick and a silicon oxide film of 4 nanometers thick are incorporated in the inter-gate insulating layer 10h. The silicon oxide films are grown through a high temperature vapor phase oxide deposition, and the silicon nitride film is deposited through a low pressure chemical vapor deposition. The inter-gate insulating layer 10h is partially merged and partially held in contact with the thin gate oxide layer 10d over the channel region 10c, and the floating sub-electrodes 10f and 10g are electrically isolated from each other by the inter-gate insulating layer 10h.

On the upper surface of the inter-gate insulating layer 10h is provided a control gate electrode 10i which is a lamination of a heavily doped n-type polysilicon layer of 150 nanometers thick and a tungsten silicide layer of 200 nanometers thick. The control gate electrode 10i is electrically isolated from the floating sub-electrodes 10f and 10g by the inter-gate insulating layer 10h. The control gate electrode 10i has a gate length of 0.8 micron and a gate width of 0.8 micron, and forms a part of a word line together with the control gate electrodes of the other floating gate field effect transistors in the same row.

The n-type dopant impurity is introduced into the heavily doped n-type source region 10a and the heavily doped n-type drain region 10b in a self-aligned manner with the control gate electrode 10i.

The thin gate oxide layer 10d, the floating gate electrode 10e, the inter-gate insulating layer 10h and the control gate electrode 10i are stacked over the channel region, and as a whole constitute a stacked gate structure.

Description is hereinbelow made on a process sequence for fabricating the floating gate field effect transistor shown in FIGS. 5 and 6. FIGS. 7A to 7F and FIGS. 8A to 8F illustrate the process sequence.

The process sequence starts with preparation of the p-type silicon substrate 11 doped at $2 \times 10^{17}$ cm$^{-3}$, and the surface orientation is (100). The thick field oxide layer 11a is grown to 0.6 micron thick by using a local oxidation of silicon technique. The thick field oxide layer 11a defines the active device areas arranged in rows and columns for the floating gate field effect transistors, and the active device areas are 0.8 micron in width. Although layers and regions are formed in each of the active device areas, description is hereinbelow focused on the active device area 11b only for the sake of simplicity.

The thin gate oxide layer 10d is thermally grown on the active device area 11b to 10 nanometers thick. A silicon nitride layer may be formed on the thin gate oxide layer 10d by using a rapid thermal nitridation, and the thin gate oxide layer 10d may be replaced with a silicon nitride layer deposited through a chemical vapor deposition.

Polysilicon is deposited to 150 nanometers thick over the entire surface of the structure, and n-type dopant impurity is thermally diffused or implanted into the polysilicon layer 21. The dopant concentration of the polysilicon layer 21 is of the order of $1 \times 10^{19}$ cm$^{-3}$.

Silicon oxide is deposited to 150 nanometers thick by using a chemical vapor deposition so as to form a silicon oxide layer 22. Subsequently, polysilicon is deposited to 50 nanometers thick through a chemical vapor deposition, and the silicon oxide layer 22 is overlain by a polysilicon layer 23. Photo-resist solution is spread over the polysilicon layer 23, and the photo-resist layer is patterned into a mask (not shown). The mask exposes the polysilicon layer 23 over a part of the channel region 10c.

Figure 7A:
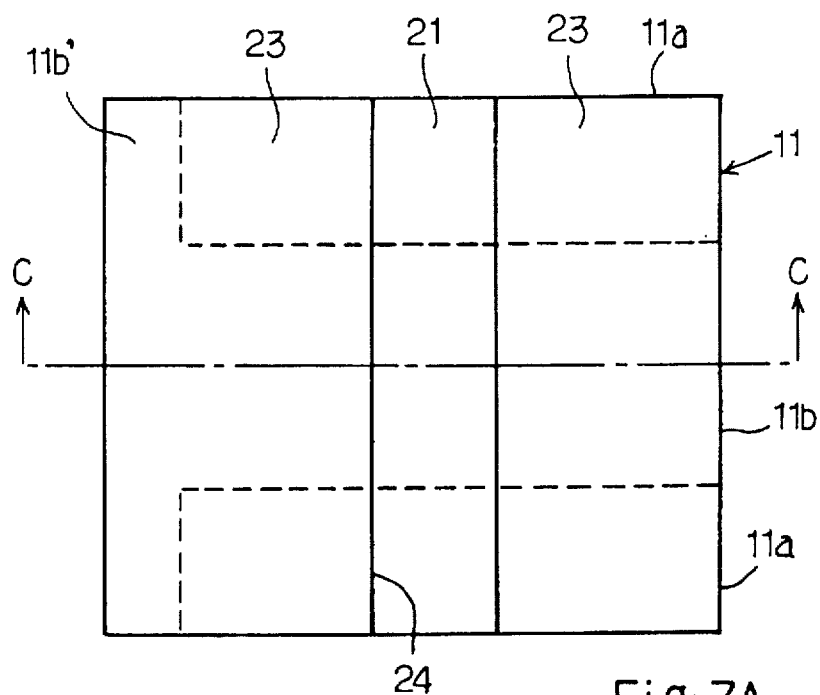
FIGS. 7A to 7F are plan views showing a process sequence for fabricating the floating gate field effect transistor shown in FIGS. 5 and 6.
Figure 8A:
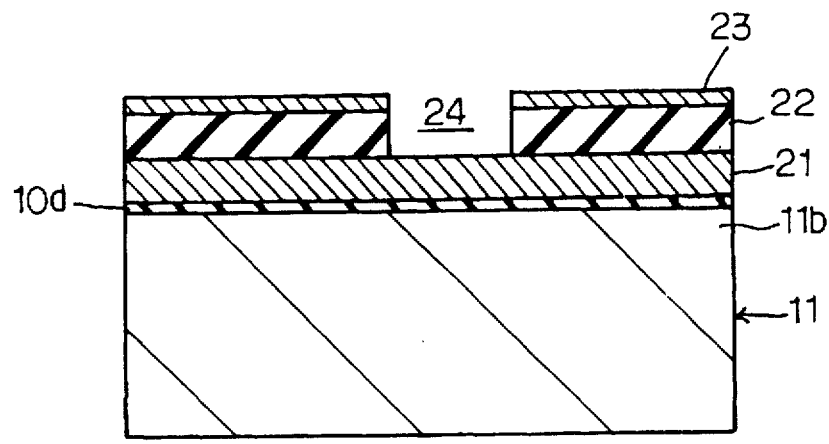
FIGS. 8A to 8F are cross sectional views taken along line C—C of FIGS. 7A to 7F and showing structures in the fabrication process.

Using the mask, the exposed portion of the polysilicon layer 23 is etched away through an anisotropic etching, and the exposed portion of the silicon oxide layer 22 is further etched away through an anisotropic etching. A slit 24 is formed in the polysilicon layer 23 and the silicon oxide layer 22, and exposes a part of the doped polysilicon layer 21 as shown in FIGS. 7A and 8A. The slit 24 is 0.4 micron in width, and extends in the longitudinal direction. The slit 24 is spaced from the longitudinal portion 11b' of the active device area 11b extending in the longitudinal direction by 0.6 micron, and two slits are formed between the adjacent two longitudinal portions 11b'.

Figure 7B:
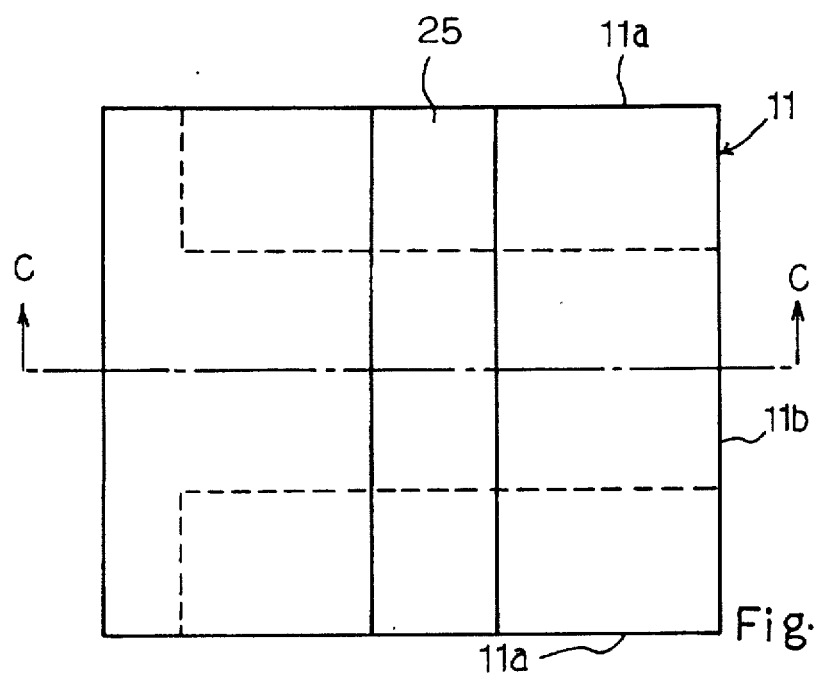
Figure 8B:
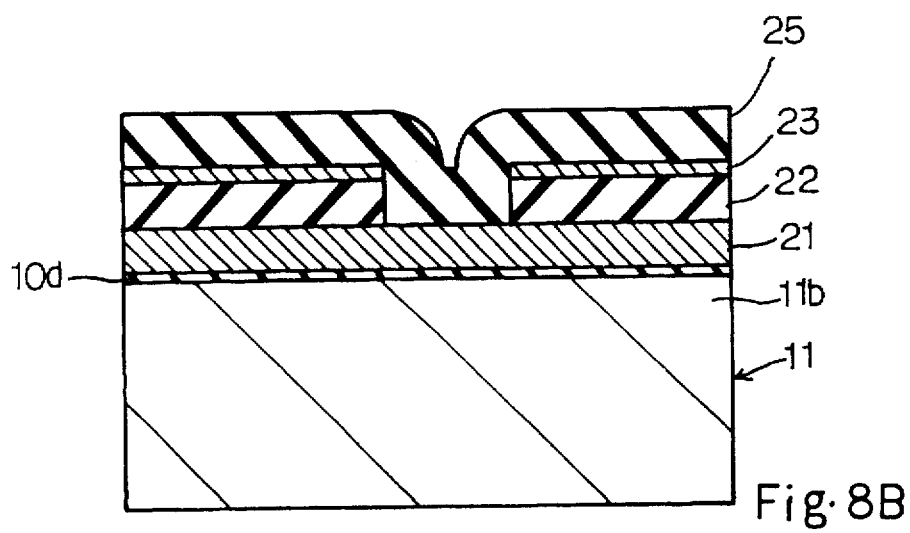

Subsequently, silicon oxide is formed to 170 nanometers thick on the entire surface of the structure through a growth technique appropriate in view of a step-coverage. A low pressure chemical vapor deposition, the high temperature vapor phase oxide deposition and a plasma-enhanced chemical vapor deposition are the appropriate growth technique. As a result, the silicon oxide layer 25 covers the polysilicon layer 23, and fills the slit 24 as shown in FIGS. 7B and 8B.

The silicon oxide layer 25 is uniformly etched away, and pieces of silicon oxide 25a and 25b are left in the slit 24. The polysilicon layer 23 protects the silicon oxide layer 22 from the etchant, and the doped polysilicon layer 21 is exposed to a gap between the pieces 25a and 25b of silicon oxide. The gap is as narrow as 60 nanometers.

Using the pieces 25a and 25b of silicon oxide as a mask, the polysilicon layer 23 and the exposed doped polysilicon layer 21 are anisotropically etched away. The polysilicon layer 23 is completely removed, and a gap is formed in the doped polysilicon layer 21. The gap reaches the thin oxide layer, and is about 60 nanometers in width.

Figure 7C:
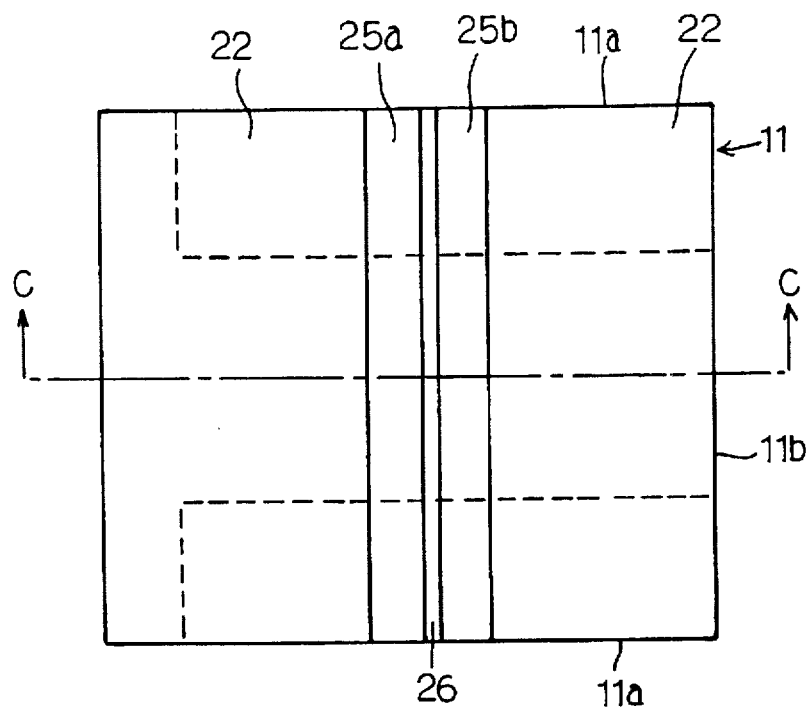
Figure 7D:
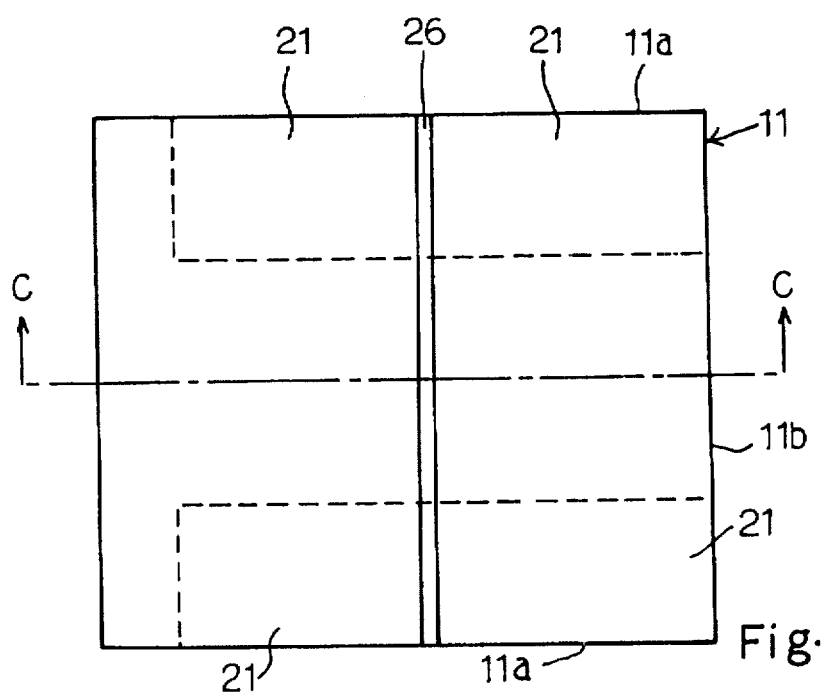
Figure 8C:
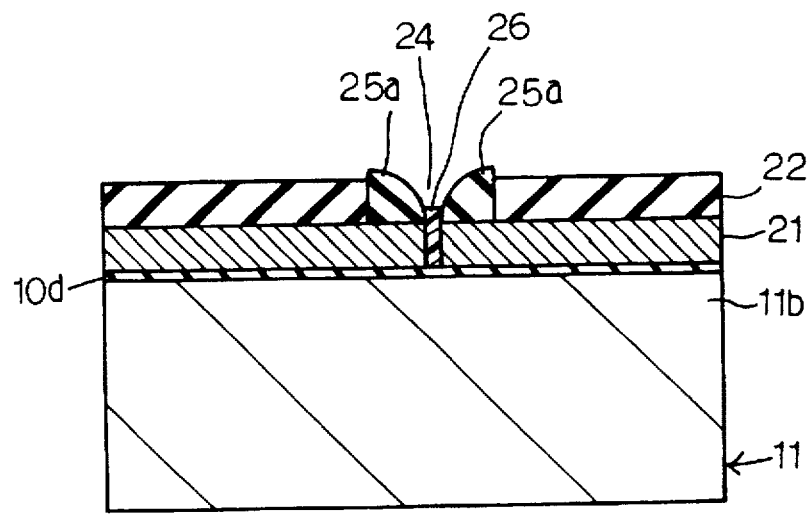
Figure 8D:
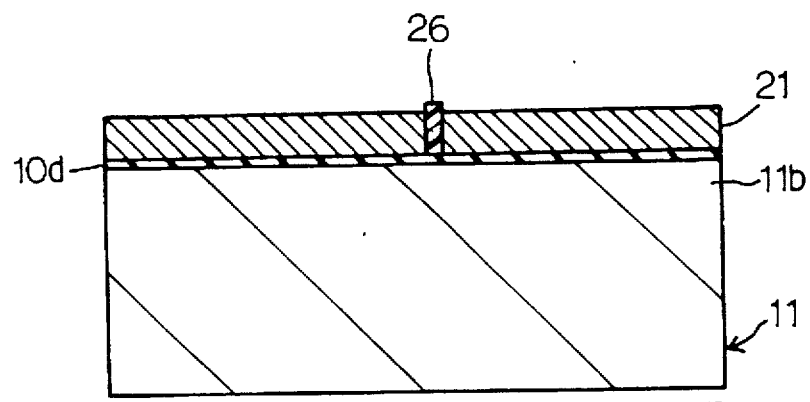

An organic compound such as a photo-resist or polyimide resin is spread over the entire surface, and fills the gap formed in the doped polysilicon layer 21. The organic compound layer is etched back, and a piece 26 of organic compound is left in the gap formed in the doped polysilicon layer 21 as shown in FIGS. 7C and 8C. The silicon oxide layer 22 and the pieces 25a and 25b of silicon oxide serve as an etching stopper in the etch-back stage.

The silicon oxide layer 22 and the pieces 25a/25b of silicon oxide are removed through a wet etching using buffered hydrofluoric acid as the etchant. However, the etchant cannot etch the piece 26 of organic compound, and the piece 26 of organic compound remains embedded in the doped polysilicon layer 21.

The piece 26 of organic compound is removed by using an appropriate etchant, and a gap 21a is formed in the doped polysilicon layer 21.

Figure 7E:
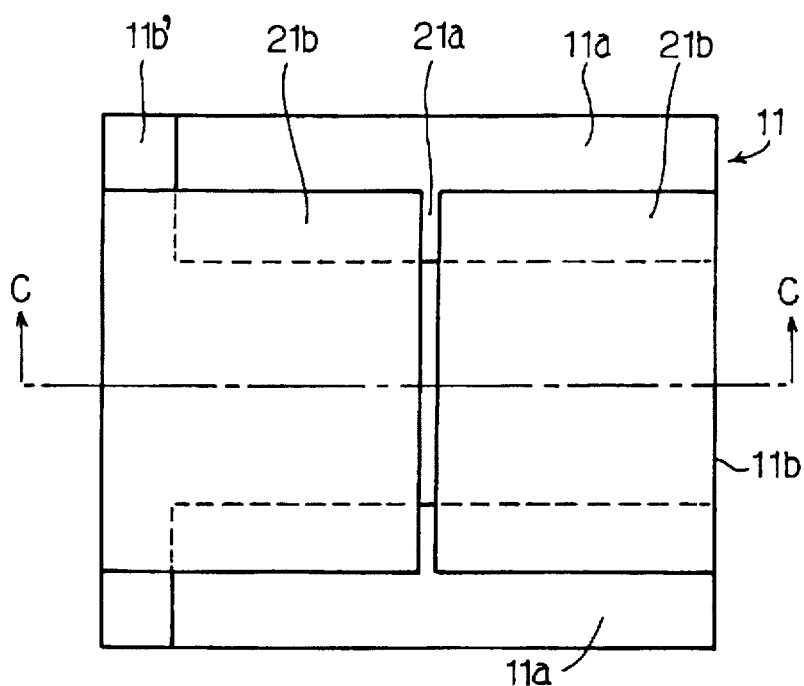
Figure 8E:
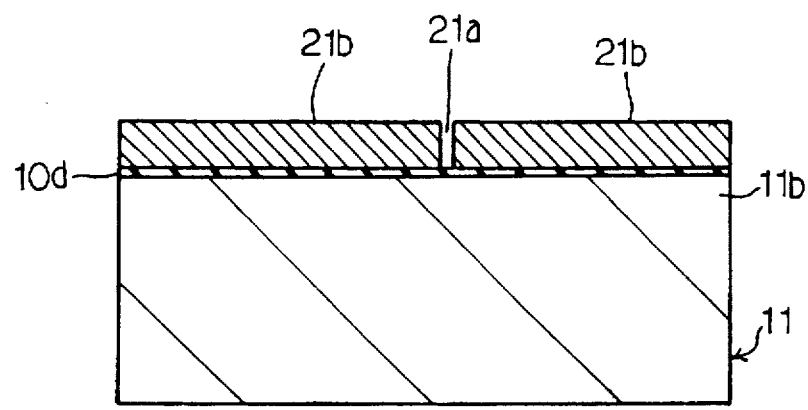

An appropriate photo-resist mask is patterned on the doped polysilicon layer 21, and covers the active device area for the heavily doped n-type source region 10a, the heavily doped n-type drain region 10b, the channel region 10c and peripheries of the thick field oxide layer 11a. The doped polysilicon layer 21 is anisotropically etched away by using the photo-resist mask (not show), and is patterned into elongated doped polysilicon strips 21b, and the elongated doped polysilicon strips 21b extend on the thick field oxide layer 11a by 0.3 micron. The resultant structure is illustrated in FIGS. 7E and 8E.

A silicon oxide layer of 7 nanometers thick is deposited on and between the elongate doped polysilicon strips 21b through high temperature vapor phase oxide deposition, a silicon nitride layer of 9 nanometers thick is deposited thereon and therebetween by using low pressure chemical vapor deposition, and a silicon oxide layer of 4 nanometers thick is deposited again through high temperature vapor-phase oxide deposition. As a result, the gap 21a is filled with the inter-gate insulating layer 10h, and the inter-gate insulating layer 10h covers the elongated doped polysilicon strips 21b.

In this instance, the silicon oxide layers and the silicon nitride layer form the inter-gate insulating layer 10h. The combination of the insulating layers and the deposition technologies are not limited to the present embodiment. However, an silicon oxide layer formed through the thermal oxidation of the doped polysilicon is not available, because the thermal silicon oxide increases leakage current.

Figure 7F:
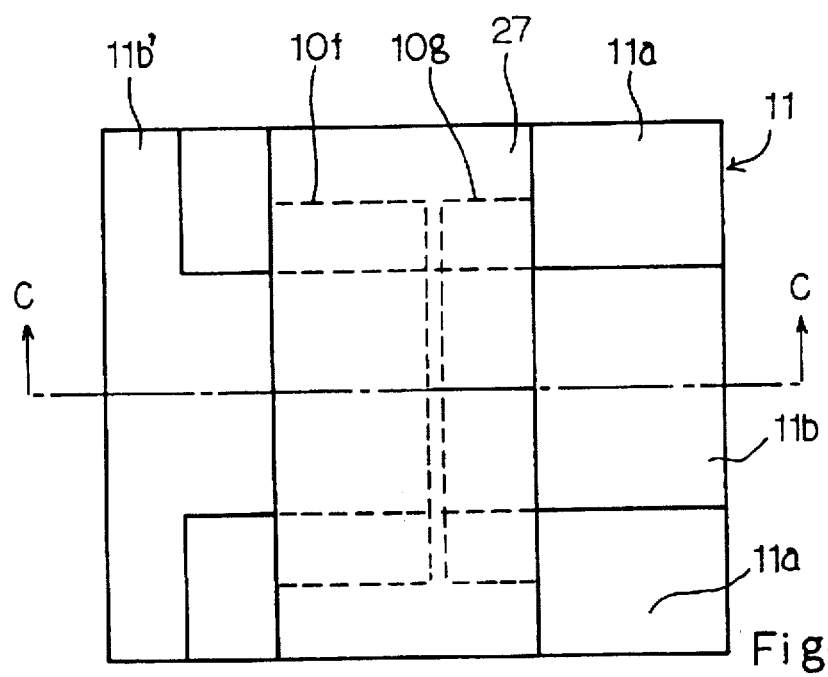
Figure 8F:
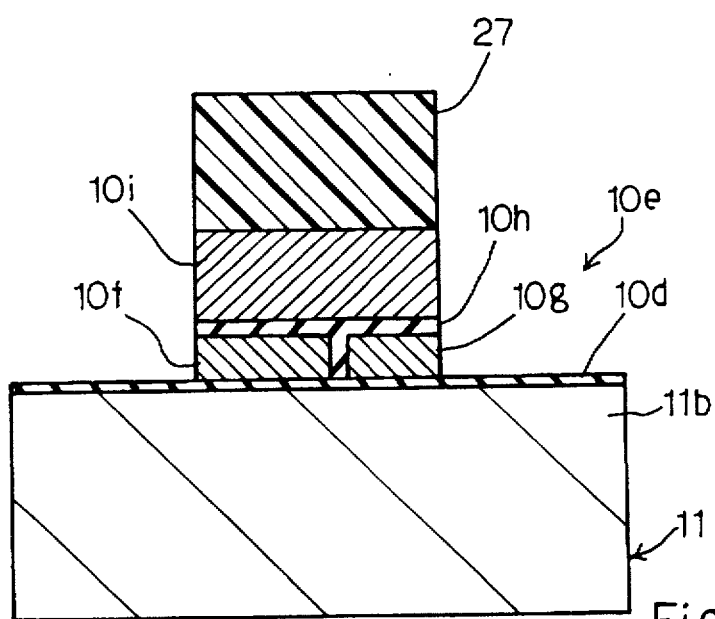

Subsequently, a heavily doped n-type polysilicon layer of 150 nanometers thick and a tungsten silicide layer of 200 nanometers thick are successively deposited over the inter-gate insulating layer 10h, and a photo-resist mask 27 is formed on the lamination of the doped polysilicon and the tungsten silicide. The photo-resist mask 27 covers an area of the lamination over the active device area 11b. The covered area of the lamination is 0.8 micron in width, and is spaced from the longitudinally extending area 11b' of the active device area 11b by 0.35 micron. Using the photo-resist mask 27, the tungsten silicide layer and the heavily doped n-type polysilicon layer are successively etched away by using an anisotropical etching technique, and are patterned into the control gate electrode 10i. The photo-resist mask 27 is further used for patterning the inter-gate insulating layer 10h and the elongated doped polysilicon strips 21b through anisotropical etchings. As a result, the floating gate electrode 10e or the floating sub-electrodes 10f and 10g are formed on the thin gate oxide layer 10d as shown in FIGS. 7F and 8F.

The photo-resist mask 27 is ashed in O₂ plasma, and is, accordingly, removed from the structure. The exposed thin gate oxide layer 10d is etched away, and, thereafter, silicon oxide is grown to 10 to 20 nanometers thick on the exposed side surface of the control gate electrode 10i, the exposed active device area 11b and the expos ed side surfaces of the floating sub-electrodes 10f and 10g through thermal oxidation.

A photo-resist mask (not shown) is formed on a part of the active device areas assigned to the heavily doped n-type drain region 10b shared between the adjacent floating gate field effect transistors in the same column, and phosphorous and arsenic are ion implanted into the exposed active device area 11b exposed between the photo-resist mask and the thick field oxide layer 11a. The photo-resist mask (not shown) is removed, and arsenic is ion implanted into the active device area exposed between the control gate electrode 10i and the thick field oxide layer 11a. Heat is applied to the resultant structure so as to drive the n-type dopant impurity into the active device area 11b. As a result, the heavily doped n-type source region 10a and the heavily doped n-type drain region 10b are formed in the active device area 11b on both sides of the gate structure as shown in FIG. 6.

An inter-level insulating layer, a contact hole for the heavily doped n-type drain region 10b and a digit line are sequentially formed, and the floating gate field effect transistor embodying the present invention is completed.

Subsequently, description is made of a write-in and an erasing with reference to FIGS. 9 to 13 of the drawings.

In the write-in, the heavily doped n-type drain region 10b is strongly biased with respect to the heavily doped n-type source region 10a, and, accordingly, increases the amount of current flowing therebetween. Then, hot carriers are produced, and are injected into the floating gate electrode 10e. The bias conditions in the write-in are 12 volts to the control gate electrode 10i, 7 volts to the heavily doped n-type drain region 10b and the ground voltage to the heavily doped n-type source region 10a and the p-type silicon substrate 11. The bias conditions are maintained for 20 micro-seconds for each of the floating gate field effect transistors.

On the other hand, the accumulated electrons are evacuated from the floating gate electrode 10e or the floating sub-electrodes 10f/10g to the p-type silicon substrate 11, and pass through the thin gate oxide layer 10d as Fowler-Nordheim tunneling current. The bias conditions in the erasing are -15 volts to the control gate electrode 10i and 3 volts to the p-type silicon substrate 11. The bias conditions are maintained for 1 second, and each of 4 kilo-bit memory cells are concurrently erased.

The bias conditions for a read-out are 5 volts to the control gate electrode 10i and 2 volts through the digit line to the heavily doped n-type drain region 10b, and the positive power voltage is 5 volts.

The floating gate field effect transistor embodying the present invention is equivalent to a series combination of a field effect sub-transistor with the floating sub-electrode 10f and a field effect sub-transistor with the floating gate electrode 10g coupled between the digit line and the source line.

Figure 9:
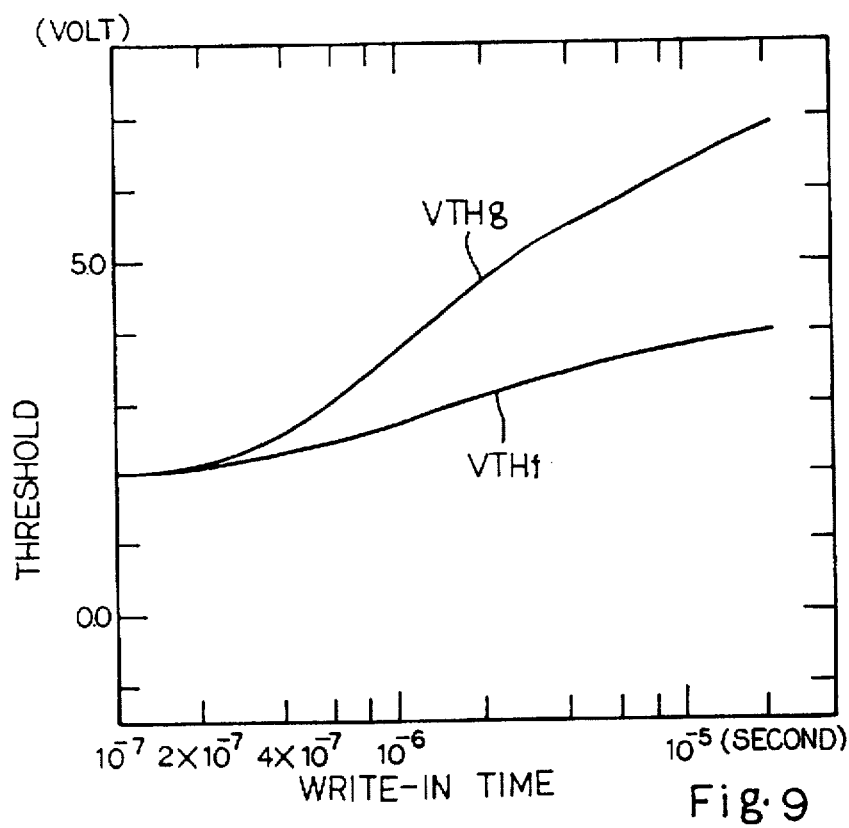
FIG. 9 is a graph showing write-in characteristics of the floating gate field effect transistor.

If the floating gate field effect transistor shown in FIGS. 5 and 6 is excellent, it is free from the over-erase, and the write-in characteristics and the erasing characteristics are as follows. FIG. 9 illustrates the threshold levels of the field effect sub-transistors under the write-in bias conditions, and FIG. 10 illustrates the threshold levels of the field effect sub-transistors under the erasing bias conditions.

While the write-in bias conditions were maintained, the field effect sub-transistor with the floating sub-electrode 10f changed the threshold Vthf as indicated by plots VTHf (see FIG. 9), and the field effect sub-transistor with the floating sub-electrode 10g changed the threshold Vthg along plots VTHg (also see FIG. 9).

Figure 10:
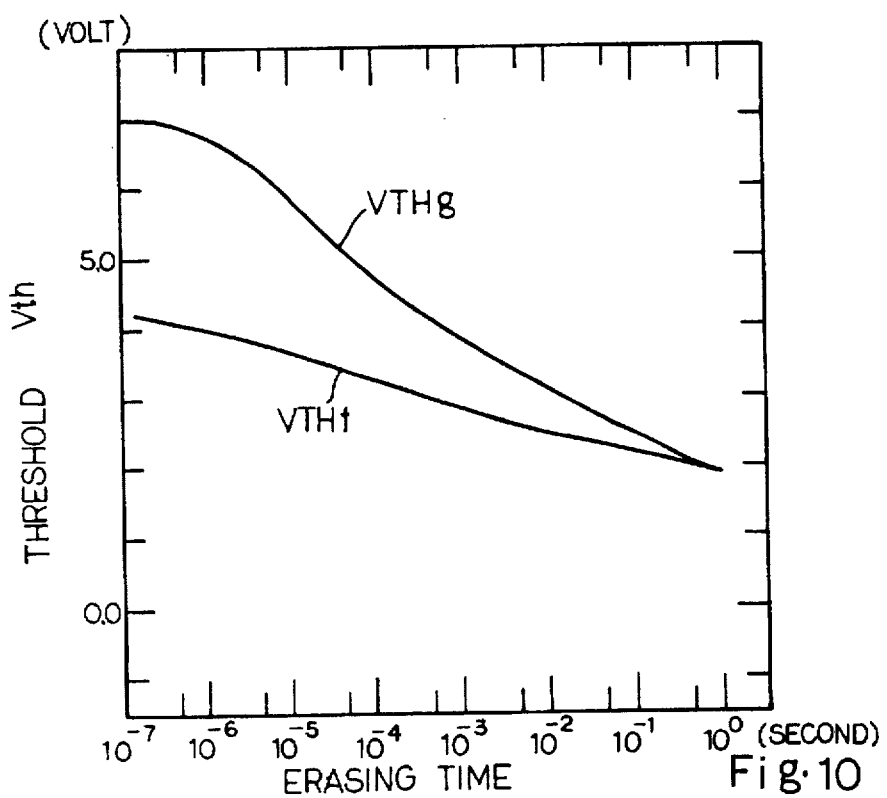
FIG. 10 is a graph showing erasing characteristics of the floating gate field effect transistor.
Figure 11:
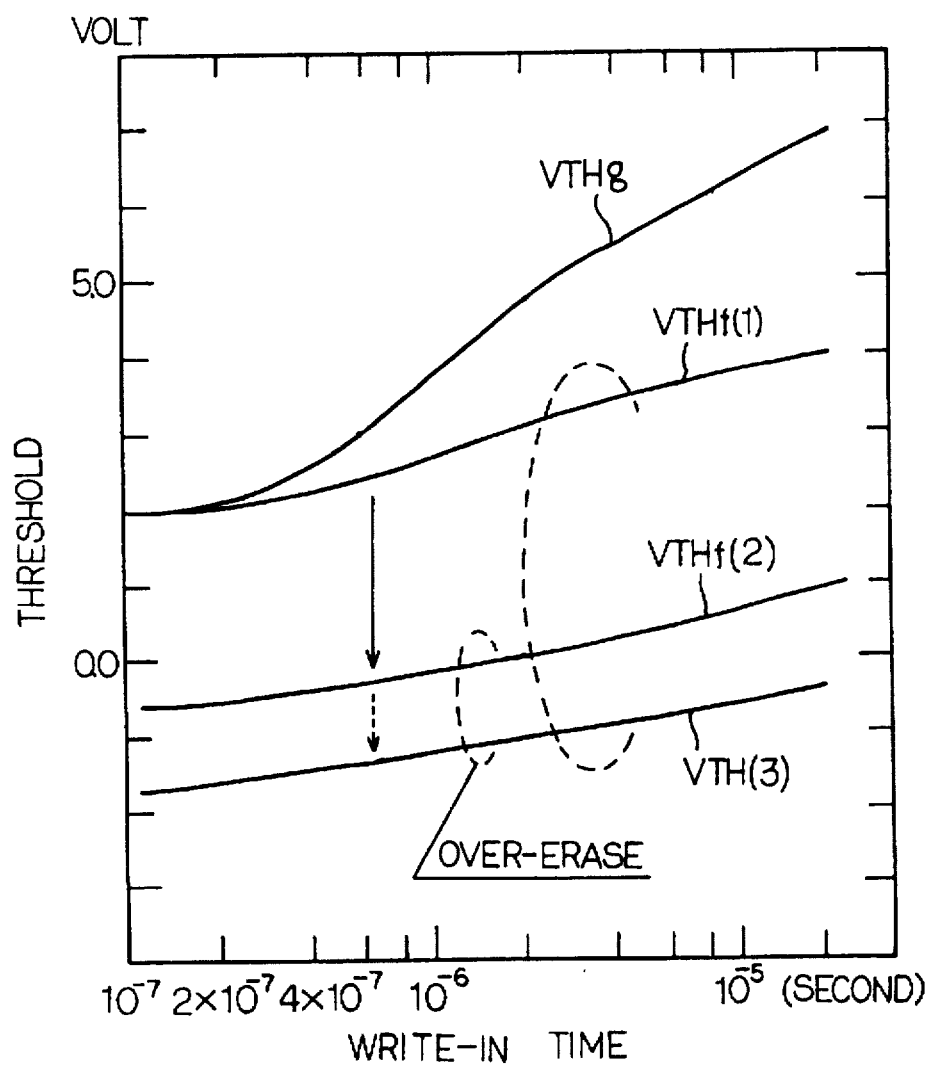
FIG. 11 is a graph showing the write-in characteristics of field effect sub-transistors before and after the over-erase takes place in one of the field effect sub-transistors.
Figure 12:
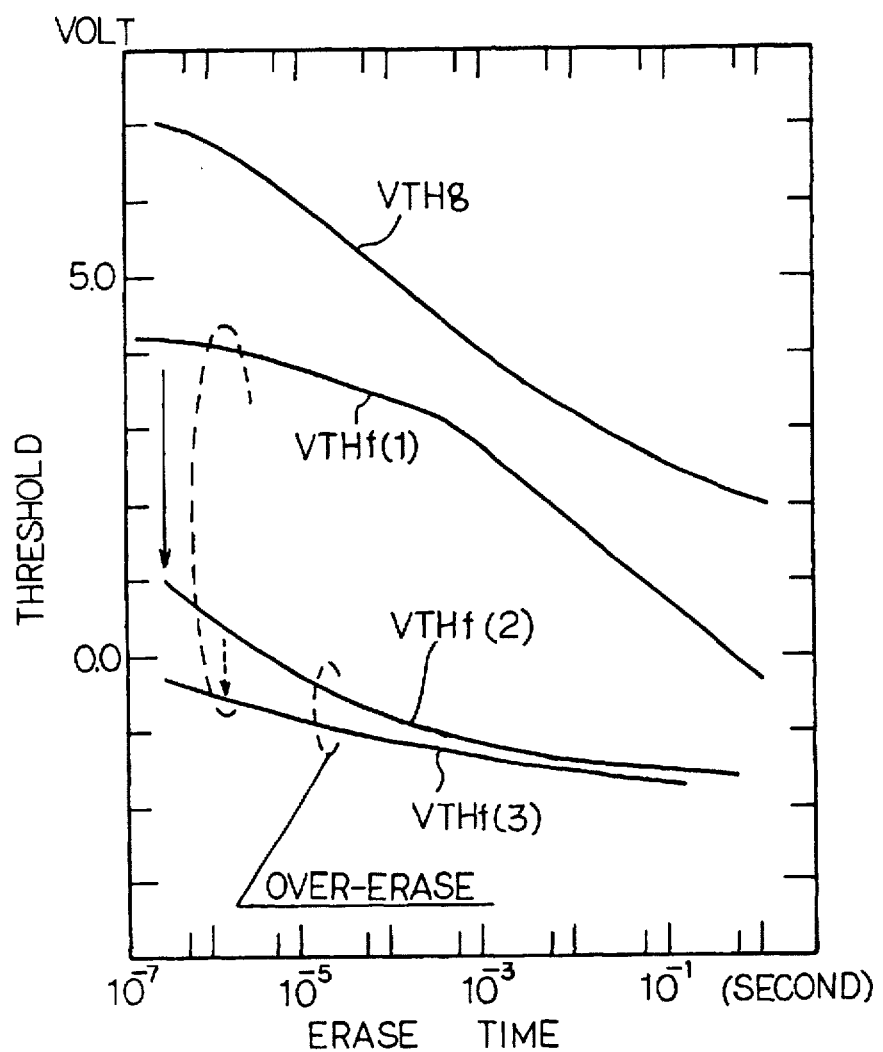
FIG. 12 is a graph showing the erasing characteristics of the field effect sub-transistors before and after the over-erase takes place in one of the field effect sub-transistors.

On the other hand, the erasing bias conditions decreased the threshold level Vthf of the field effect sub-transistor with the floating sub-electrode 10f along plots VTHf (see FIG. 10), and the threshold level Vthg of the field effect sub-transistor with the floating sub-electrode 10f traced plots VTHg of FIG. 10.

Thus, the threshold Vthf was changed between 2 volts and 4 volts, and the threshold Vthg was changed between 2 volts and 7 volts. The range of the threshold Vthf was narrower than the range of the threshold Vthg, because the floating sub-electrode 10f is spaced from the origin of hot carrier or the heavily doped n-type drain region 10b by 0.25 micron. In other words, the injection efficiency of hot carrier to the floating sub-electrode 10f is lower than that of the floating sub-electrode 10g.

After the entry into the write-in state, the read-out gate voltage of 5 volts caused the field effect sub-transistor with the floating sub-electrode 10f to turn on. However, the field effect sub-transistor with the floating sub-electrode 10g was turned off in the presence of the read-out gate voltage, and the floating gate field effect transistor 10 did not allow current to flow through the channel region 10c.

On the other hand, when the electrons were evacuated from the floating sub-electrodes 10f and 10g, the field effect sub-transistors had thresholds Vthf and Vthg of 2 volts, and the read-out gate voltage caused both field effect sub-transistors to turn on. For this reason, the floating gate field effect transistor 10 allowed current to flow through the channel region 10c.

When the over-erase took place only in the floating sub-electrode 10f, the field effect sub-transistor with the floating sub-electrode 10g behaved as the excellent one, and the threshold Vthg was changed along plots VTHg as similar to those shown in FIGS. 9 and 10. The field effect sub-transistor with the floating sub-electrode 10f behaved as similar to the excellent one before the over-erase took place (see plots VTHf(1) of FIGS. 11 and 12). However, the over-erase changed the write-in/erasing characteristics of the field effect sub-transistor with the floating sub-electrode 10f, and behaved as a depletion transistor. The threshold Vthf was gradually lowered as indicated by plots VTHf(2) and VTHf(3) through repetition of the erase/write-in and finally reached around −2 volts determined by the erasing bias conditions. The write-in could not increase the threshold Vthf to 4 volts.

In this situation, the field effect sub-transistor with the floating sub-electrode 10f allowed current to pass therethrough. However, the field effect sub-transistor with the floating sub-electrode 10g cut off or transferred the current depending upon the amount of accumulated electrons. Namely, when the floating sub-electrode 10g accumulated electrons, the threshold Vthg was 7 volts, and the field effect sub-transistor did not allow the current to pass therethrough. On the other hand, when the floating sub-electrode was evacuated, the threshold Vthg was 2 volts, and the field effect sub-transistor allowed the current to pass in the presence of the read-out gate voltage.

Thus, the floating gate field effect transistor 10 behaved as if it was excellent, and the over-erase did not affect the function of the floating gate field effect transistor 10.

Figure 13:
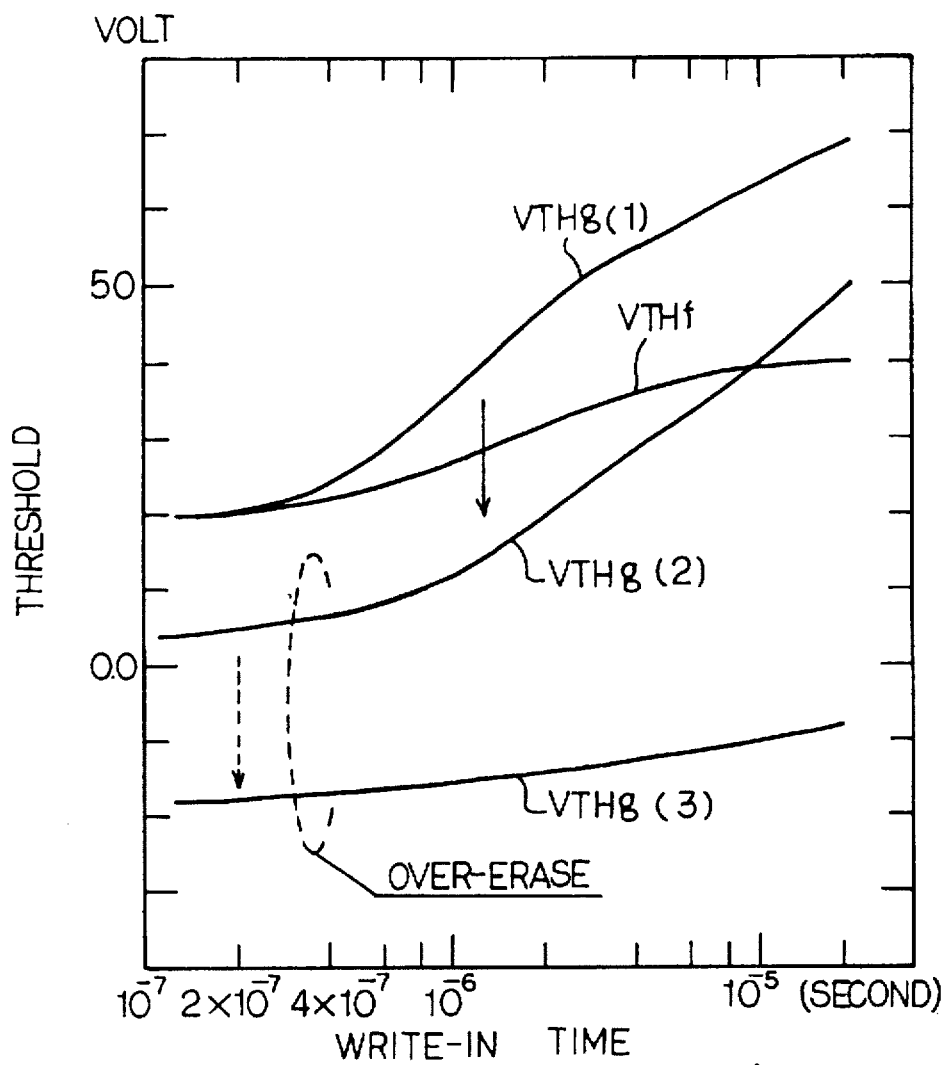
FIG. 13 is a graph showing the write-in characteristics of the field effect sub-transistors before and after the over-erase takes place in the other field effect sub-transistor.
Figure 14:
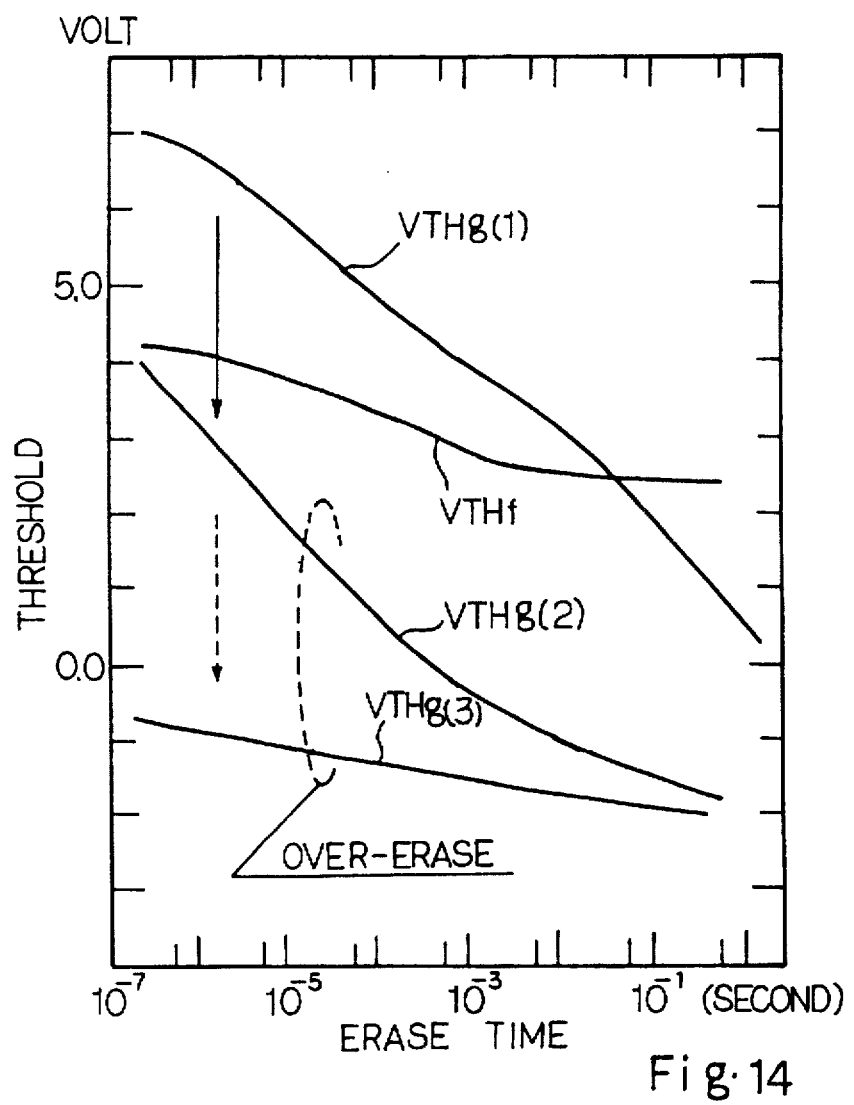
FIG. 14 is a graph showing the erasing characteristics of the field effect sub-transistors before and after the over-erase takes place in the other field effect sub-transistor.

On the other hand, when the over-erase took place in the field effect sub-transistor with the floating sub-electrode 10g, the other field effect sub-transistor behaved as similar to that of the excellent field effect transistor 10, and the threshold Vthg was changed between 2 volts and 7 volts along plots VTHg shown in FIGS. 13 and 14. While the threshold Vthg was higher than 5 volts, the field effect sub-transistor with the floating sub-electrode 10g behaved as if it was excellent. However, the over-erase progressed through repetition of the erase and the write-in (see VTHg (1)–VTHg(3) in FIGS. 13 and 14), and the threshold Vthg was changed between zero and −2 volts. Therefore, the field effect sub-transistor with the floating sub-electrode 10g was turned on in the presence of the read-out gate voltage of 5 volts. As described hereinbefore, the threshold Vthf in the write-in state was 4 volts, and the field effect sub-transistor with the floating sub-electrode 10f turned on in the presence of the read-out gate voltage. Thus, even though the floating gate field effect transistor 10 was subjected to the write-in, the read-out gate voltage caused the floating gate field effect transistor 10 to turn on, and the floating gate field effect transistor 10 became defective.

As will be appreciated from the foregoing description, the floating gate electrode split into the plurality of sub-electrodes is partially affected by over-erase, and the remaining sub-electrodes maintain the excellent function of the floating gate type field effect transistor.

Second Embodiment

Figure 15:
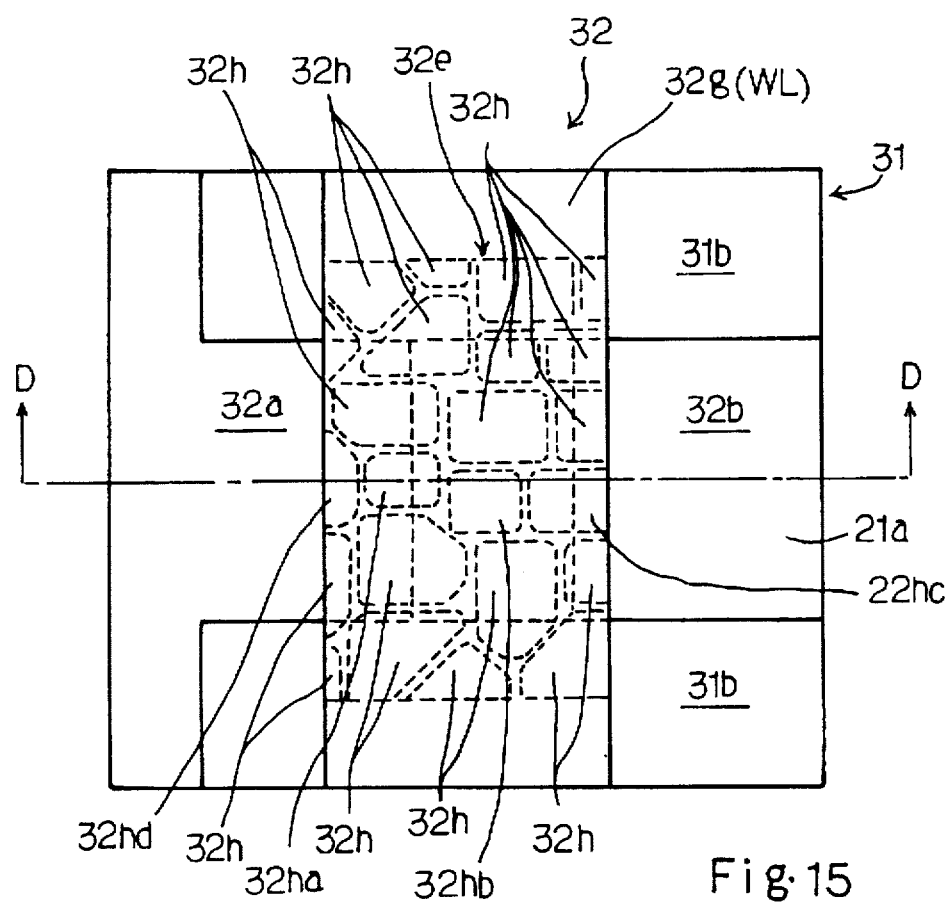
FIG. 15 is a plan view showing the layout of another floating gate type field effect transistor according to the present invention.
Figure 16:
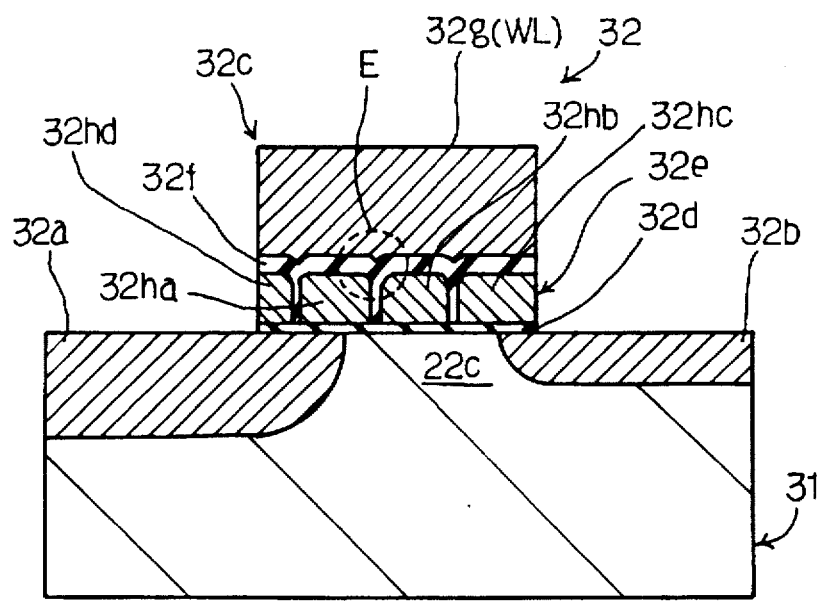
FIG. 16 is a cross sectional view taken along line D—D of FIG. 15 and showing the structure of the floating gate type field effect transistor.
Figure 17:
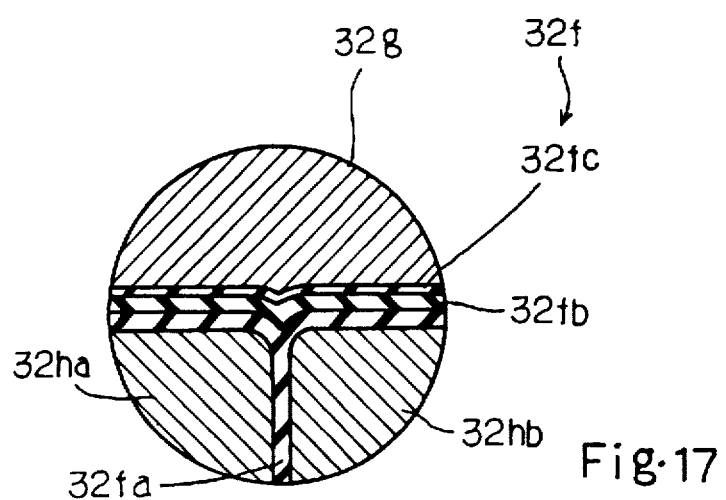
FIG. 17 is a cross sectional view enlarging a part of the floating gate type field effect transistor encircled in E of FIG. 16.

Turning to FIGS. 15 and 16 of the drawings, another floating gate type field effect transistor embodying the present invention is fabricated on a p-type silicon substrate 31 or a semiconductor layer, and the surface orientation is (100). The surface portion of the p-type silicon substrate 31 is doped at $2 \times 10^{17}$ $cm^{-3}$. The floating gate type field effect transistor is incorporated in a NOR type memory block, and the NOR type memory block forms a part of a memory device together with other NOR type memory blocks.

An active device area 31a is defined by a thick field oxide layer 31b, and is assigned to the floating gate type field effect transistor 32. The thick field oxide layer 31b is 0.6 micron in thickness.

The floating gate type field effect transistor 32 includes a heavily doped n-type source region 32a formed in the left side portion of the active device area 31a, a heavily doped n-type drain region 32b formed in the right side portion of the active device area 31b and a channel region 32c between the heavily doped n-type source region 32a and the heavily doped n-type drain region 32b. The heavily doped n-type source region 32a firstly extends from the channel region 32c in the lateral direction, and turns at a right angle so as to extend in the longitudinal direction. The heavily doped n-type source region 32a is electrically connected through the longitudinally extending portion to a heavily doped n-type source region of other floating gate type field effect transistors in the same row. On the other hand, the drain region 32b is shared with a floating gate type field effect transistor located on the right side of the floating gate type field effect transistor 32, and a digit line (not shown) is held in contact with the heavily doped n-type drain region 32b. The digit line (not shown) extends over an inter-level insulating layer (not shown) in a perpendicular direction to a word line WL.

The heavily doped n-type source region 32a and the p-type silicon substrate 31 form a p-n junction around 0.4 micron, and the p-n junction between the heavily doped n-type drain region 32b and the p-type silicon substrate 31 is 0.15 micron in depth. The heavily doped n-type source region 32a is spaced from the heavily doped drain region 32b by 0.45 micron.

The floating gate type field effect transistor 32 further includes a stacked gate structure 32c provided over the channel region 32c, and the heavily doped n-type source region 32a and the heavily doped n-type drain region 32b are partially overlapped with the stacked gate structure 32c. The heavily doped n-type source region 32a extends beneath the stacked gate structure 32c by 0.25 micron, and the heavily doped n-type drain region 32b extends beneath the stacked gate structure 32c by 0.1 micron.

The stacked gate structure 32c has a thin tunnel oxide layer 32d, a floating gate electrode 32e, an intergate insulating layer 32f and a control gate electrode 32g. The thin tunnel oxide layer 32d is thermally grown to 10 nanometers thick, and floating sub-electrodes 32h and 32ha to 32hd form in combination the floating gate electrode 32e. Silicon crystal grains serve as the floating sub-electrodes 32h, 32ha, 32hb 32hc and 32hd, respectively, and are doped at $5 \times 10^{20}$ $cm^{-3}$. The silicon crystal grains are 150 nanometers in height, and the grain diameter ranges between 20 nanometers to 35 nanometers. The grain diameter is larger than the thickness of the polysilicon layer or the grain height, but is smaller than the distance between the heavily doped n-type source region 32a and the heavily doped n-type drain region 32b. For this reason, the floating sub-electrodes 32ha and 32hd occupy the inner portion of the heavily doped n-type source region 32a, the floating sub-electrode 32hb is provided over the channel region 32c only, and the inner portion of the heavily doped n-type drain region 32b is overlapped with a part of the floating sub-electrode 32hc as will be seen from FIG. 16. However, there is not any floating sub-electrode occupying over both of the heavily doped n-type source region 32a and the heavily doped n-type drain region 32b.

Gaps take place among the floating sub-electrodes 32h, 32ha, 32hb, 32hc and 32hd. The present inventor confirmed that the gaps were of the order of 10 nanometers through an SEM observation.

The inter-gate insulating layer 32f fills the gaps among the floating sub-electrodes 32h, 32ha, 32hb, 32hc and 32hd. The inter-gate insulating layer is, by way of example, constituted by a silicon oxide sub-layer 32fa of 7 nanometers thick, a silicon nitride sub-layer 32fb of 9 nanometers thick and a silicon oxide sub-layer 32fc of 4 nanometers thick. The silicon oxide sub-layers 32fa and 32fc are deposited through high temperature vapor phase oxide deposition, and the silicon nitride sub-layer 32fb is deposited through low pressure chemical vapor deposition.

The control gate electrode 32g is implemented by a lamination of a heavily doped n-type polysilicon layer and a tungsten silicide layer. The heavily doped n-type polysilicon layer is 150 nanometers thick, and the tungsten silicide layer is 200 nanometers thick. The control gate electrode 32g forms a part of the word line WL extending in the longitudinal direction, and occupies a square area of 0.8 micron by 0.8 micron over the active device area 31a.

Figure 18A:
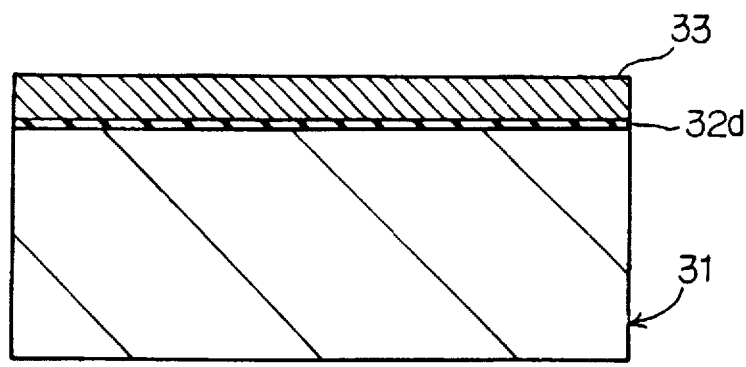
FIGS. 18A to 18C are cross sectional views taken along line D—D of FIG. 15 and showing essential stages of a process sequence for fabricating the floating gate type field effect transistor shown in FIGS. 15 and 16.
Figure 18B:
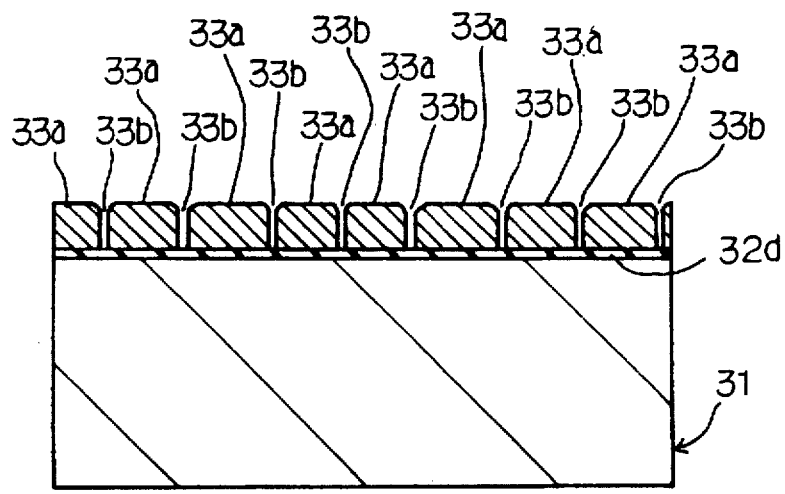
Figure 18C:
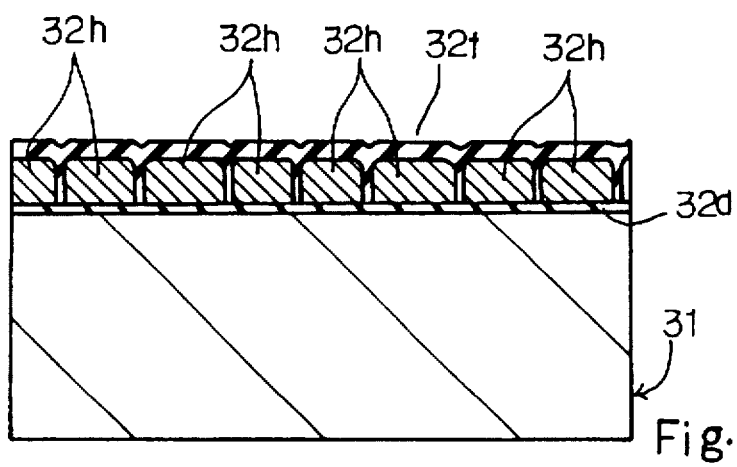

FIGS. 18A to 18C show essential stages of a process for fabricating the floating gate type field effect transistor 32. First, the p-type silicon substrate 31 is prepared, and the thick field oxide layer 31b and the thin tunnel oxide layer 32d are grown on the surface of the p-type silicon substrate 31.

Subsequently, non-doped polysilicon is deposited to 150 nanometers thick over the entire surface of the structure by using a chemical vapor deposition at 650 degrees centigrade. Phosphorous is diffused into the non-doped polysilicon layer at 850 degrees centigrade, and the phosphorous doped polysilicon layer is treated in nitrogen atmosphere at 980 degrees centigrade. Then, the n-type polysilicon 33 doped at $5 \times 10^{20}$ $cm^{-3}$ covers the entire surface of the structure, and the grain diameter ranges between 0.2 nanometer to 0.35 nanometer as shown in FIG. 18A. The silicon crystal grains are not laminated, but form a single layer on the thick field oxide layer 31b and the thin tunnel gate oxide layer 32d as shown in FIG. 16. Additionally, silicon crystal grains form a laminated polysilicon layer for the floating sub-electrodes 10f and 10g, and the grain diameter is less than 50 nanometers.

The heavily doped n-type polysilicon layer 33 has grain boundaries where phosphorous is heavily segregated. The grain boundaries are selectively etched through a wet etching using hot phosphoric acid as an etchant, and the silicon crystal grains 33a are separated from one another as shown in FIG. 18B. The grain diameter of the silicon crystal grains 33a is larger than the thickness of the heavily doped n-type polysilicon layer 33, and, for this reason, the gaps 33b between the silicon crystal grains 33a reach the thin tunnel oxide layer 32d. The silicon crystal grains 33a are roughly equal in height to one another.

The layer of the silicon crystal grains 33a is patterned into an elongated layer over the active device area as similar to the first embodiment. The silicon oxide sub-layer 32fa is deposited to 7 nanometers thick through high temperature vapor phase oxide deposition, and the silicon nitride sub-layer 32fb is deposited to 9 nanometers thick by using low pressure chemical vapor deposition. Finally, the silicon oxide sub-layer 32fc is deposited to 4 nanometers thick through high temperature vapor phase oxide deposition. As a result, the inter-gate insulating layer 32f fills the gaps 33b, and covers the floating gate electrode 32e as shown in FIG. 18C.

The silicon oxide sub-layer 32fa is deposited at an extremely low speed such as 0.2 nanometer per minute, and the silicon oxide thus grown at the extremely low speed perfectly fill the gaps 33b.

A surface portion of the silicon oxide sub-layer 32fa may be converted to a silicon nitride layer through a rapid thermal nitriding (RTN) in $N_2O$ atmosphere at 1100 degrees centigrade.

The lamination of the heavily doped n-type polysilicon layer and the tungsten silicide layer covers the layer of silicon crystal grains 33a, and the lamination, the inter-gate insulating layer 32f and the layer of silicon crystal grains 33a are patterned into the stacked gate structure 32c by using lithographic techniques.

N-type dopant impurities are ion implanted into both side portions in a self-aligned manner with the stacked gate structure 32c, and form the heavily doped n-type source region 32a and the heavily doped n-type drain region 32b through a heat treatment.

An inter-level insulating layer is provided over the stacked gate structure 32c, and a contact hole is formed in the inter-level insulating layer so as to expose the heavily doped n-type drain region 32b. Conductive substance is deposited over the entire surface of the structure, and the conductive layer is patterned into digit lines.

If the silicon crystal grains are smaller than those of the first embodiment, wet etching is not available for forming the gaps 33a. The doped polysilicon layer 21 is lighter in dopant concentration than the doped polysilicon 33, and gaps in the doped polysilicon layer 21 are narrower than the gaps 33a. As described hereinbefore, the silicon crystal grains of the doped polysilicon layer 21 form a multi-layer structure, and grain boundaries extend not only in the vertical direction but also in the oblique and horizontal directions. If the doped polysilicon layer 21 is subjected to the wet etching, crystal defects take place, and the crystal defects deteriorate the reliability of the floating gate electrode.

Although the over-erase takes place in the floating gate type field effect transistor 32, the floating sub-electrodes 22h prevent the floating gate type field effect transistor 32 from rejection, and increase the production yield rather than the floating gate electrode 10e. The production yield is increased in inverse proportion to an area ratio of the floating sub-electrodes such as 32hc over the heavily doped n-type drain region 32b to the floating gate electrodes over the channel regions such as 32ha and 32hb.

The fabrication process for the second embodiment is simpler than the fabrication process for the first embodiment.

Figure 19:
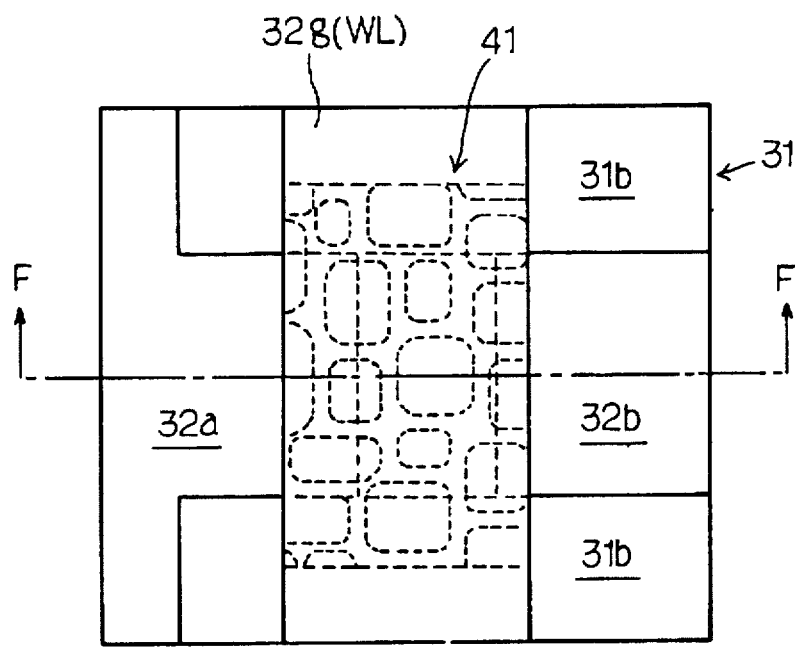
FIG. 19 is a plan view showing the layout of yet another floating gate type field effect transistor according to the present invention.
Figure 20:
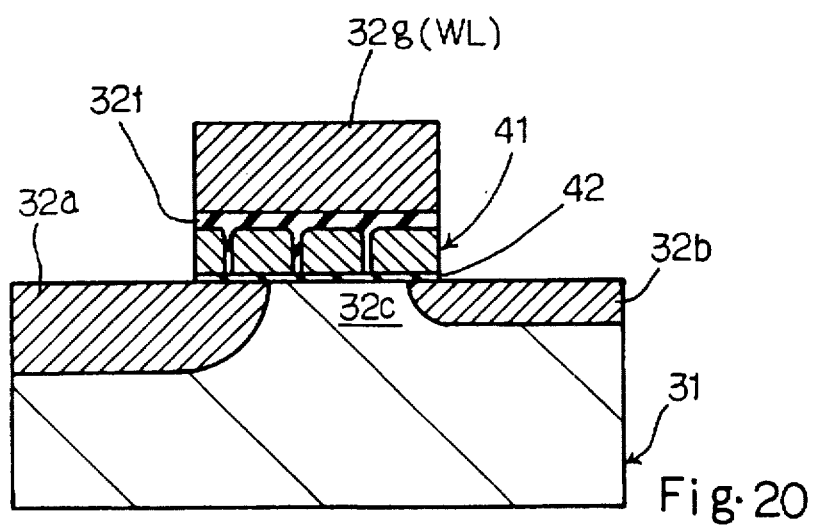
FIG. 20 is a cross sectional view taken along line F—F of FIG. 19 and showing the structure of the floating gate type field effect transistor.

FIGS. 19 and 20 illustrate a modification of the second embodiment, and a floating gate electrode 41 and a thin tunnel insulating layer 42 are different from those of the floating gate electrode 32e. Other regions and layers of the modification are labeled with the same references designating the corresponding regions and layers of the second embodiment without detailed description.

Figure 21A:
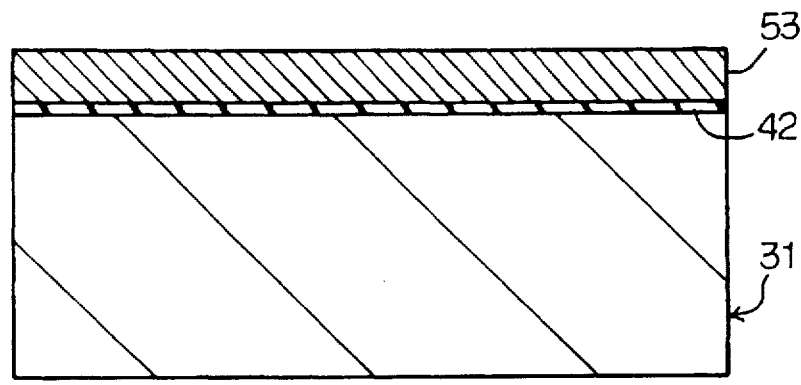
FIGS. 21A to 21D are cross sectional views taken along line F—F and showing a process sequence for fabricating the floating gate type field effect transistor.

The floating gate electrode 41 is formed through a process described hereinbelow with reference to FIGS. 21A to 21D. First, a p-type silicon substrate 31 is prepared, and a thick field oxide layer is selectively grown on a major surface of the p-type silicon substrate 31. An active device area defined by the thick field oxide layer is covered with a thin silicon oxide layer. The rapid thermal nitriding covers the surface of the thin silicon oxide layer and the surface of the thick field oxide layer to silicon nitride layers, and the silicon nitride layer and the remaining thin silicon oxide layer serve as the tunnel insulating layer 42. A heavily doped n-type polysilicon layer 53 is deposited over the entire surface of the structure as similar to the second embodiment, and the resultant structure is illustrated in FIG. 21A.

Figure 21B:
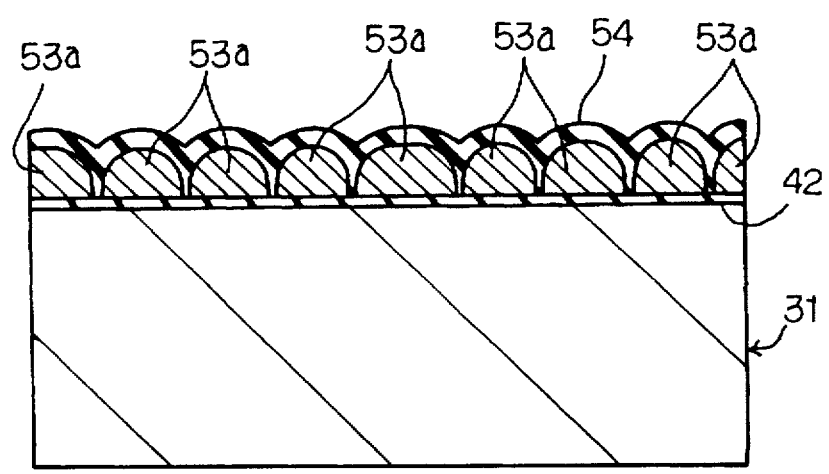

The heavily doped n-type polysilicon layer 53 is thermally oxidized, and the thermal oxidation proceeds along grain boundaries of the heavily doped n-type polysilicon layer 53. As a result, a silicon oxide layer 54 separates the heavily doped n-type polysilicon layer 53 into a plurality of silicon crystal grains 53a as shown in FIG. 21B. The present inventor measured the thickness of the silicon oxide layer 54 through the SEM observation, and the silicon oxide layer 54 was 40 to 50 nanometers thick on the upper surfaces of the silicon crystal grains 53a and 20 to 30 nanometers thick between the silicon crystal grains 53a.

Figure 21C:
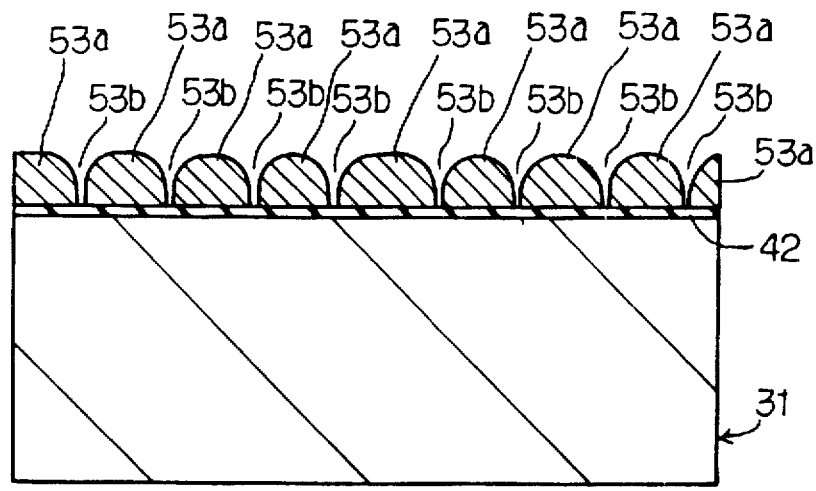

The silicon oxide layer 54 is etched away in a wet etching using buffered hydrofluoric acid as an etchant, and gaps 53b takes place as shown in FIG. 21C. While the buffered hydrofluoric acid is etching the silicon oxide layer 54, the silicon nitride layer protects the tunnel insulating layer 42 from the buffered hydrofluoric acid.

Figure 21D:
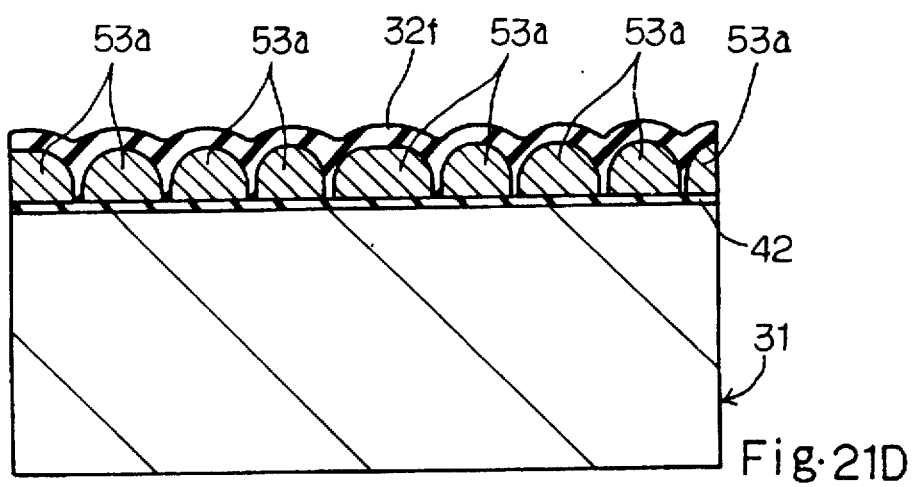

Subsequently, the layer of silicon crystal grains 53b is patterned into an elongated layer, and silicon oxide is deposited over the entire surface of the structure. The silicon oxide fills the gaps 53b, and the silicon oxide layer serves as the inter-gate insulating layer 32f together with a silicon nitride layer and a silicon oxide layer as similar to the second embodiment. The resultant structure is illustrated in FIG. 21D.

Thereafter, the process traces the later stages as similar to the second embodiment. Namely, a stacked gate structure is patterned from the lamination, and the heavily doped n-type source region 32a and the heavily doped n-type drain region 32b are formed on both sides of the stacked gate structure. An inter-level insulating layer covers the stacked gate structure and the heavily doped n-type source/drain regions 32a/32b, and a contact hole exposes the heavily doped drain region 32b. A digit line is patterned so as to be held in contact with the heavily doped n-type drain region.

The modification achieves all the advantages of the second embodiment.

As will be appreciated from the forgoing description, even if the over-erase takes place, the over-erase merely damages one of the many floating gate sub-electrodes, and the remaining floating sub-electrodes rescue the floating gate type field effect transistor.

NOR Memory Block

Figure 22:
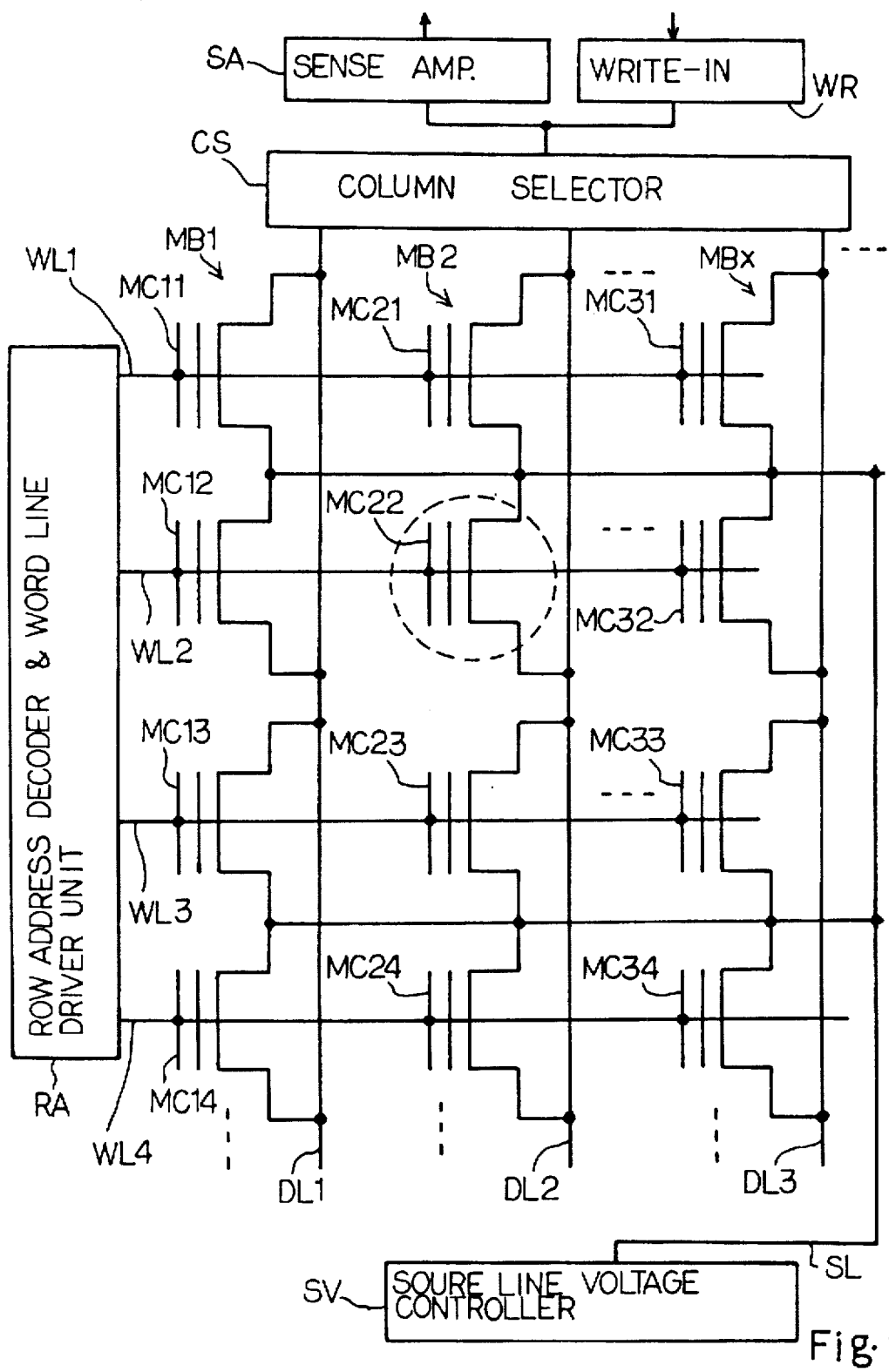
FIG. 22 is a circuit diagram showing a NOR type memory block implemented by the floating gate type field effect transistors of the present invention.

FIG. 22 illustrates NOR type memory cell blocks MB1, MB2, . . . MB3, and the memory cells are labeled with MC11/MC12/MC13/MC14, MC21/MC22/MC23/MC24, . . . . . MC31/MC32/MC33/MC34. The memory cells MC11 to MC34 are implemented by the floating gate type field effect transistors according to the present invention. Word lines WL1, WL2, WL3, WL4, . . . . . are shared among the NOR type memory cell blocks MB1 to MB3, and digit lines DL1, DL2, . . . . , DL3 are respectively provided for the memory cell blocks MB1, MB2, MB3, . . . . The word lines WL1 to WL4 are coupled to the gate electrodes of the associated floating gate type field effect transistors, and the digit lines DL1 to DL3 are coupled to the drain regions of the associated floating gate type field effect transistors.

A row address decoder and word line driver unit RA selects a word line WL1/WL2/WL3/WL4, and a sense amplifier SA and a write-in circuit WR are selectively coupled through a column selector CS to a digit line DL1/DL2/DL3. The source line SL is coupled to a source line voltage controller SV.

The over-erase is assumed to take place in the memory cell MC22. If the over-erase damages the floating gate sub-transistor on the source side, the floating gate sub-transistor on the drain side maintains the function of the memory cell MC22 as described in conjunction with the first embodiment.

On the other hand, if the over-erase damages the floating gate sub-transistor on the drain side, the memory cell MC22 cannot be changed to the write-in state. However, the memory cell MC22 does not affect the write-in operation on the other memory cells MC21, MC23, MC24 of the same memory cell block MB2.

In detail, when the memory cell MC23 is changed to the write-in state, the word line WL3 is boosted to 12 volts, the other word lines WL1, WL2 and WL4 are maintained at the ground voltage, and the write-in circuit WR supplies a write-in drain voltage of 6.5 volts through the column selector CS to the digit line DL2. If the memory cell MC22 is implemented by the prior art floating gate type field effect transistor, the over-erase changes the memory cell MC22 to the depletion state, and the write-in drain voltage is discharged to the source line SL. However, the floating gate type field effect transistor according to the present invention blocks the write-in drain voltage, because the floating gate sub-transistor on the source side is turned off. Thus, the floating gate type field effect transistor according to the present invention minimizes the influence of the over-erase.

Although particular embodiments of the present invention have been shown and described, it will be obvious to those skilled in the art that various changes and modifications may be made without departing from the spirit and scope of the present invention. The floating gate field effect transistors are effective against the over-erase if the tunneling current is evacuated to the source region. The p-type substrate 11 may be a p-type well formed in an n-type silicon substrate. The control gate electrode may be formed of conductive material different from the lamination or another combination of conductive layers.

What is claimed is:

1. An over-erase resistant floating gate type field effect transistor fabricated on a semiconductor layer of a first conductivity type, comprising:

a source region having a second conductivity type opposite to said first conductivity type, and formed in a surface portion of said semiconductor layer;

a drain region of said second conductivity type formed in another surface portion of said semiconductor layer spaced from said surface portion;

a channel region provided in yet another surface portion of said semiconductor layer between said source region and said drain region;

a first gate insulating layer covering at least said channel region, and having a thickness for allowing a tunneling current to pass therethrough;

a floating gate electrode having a plurality of sub-electrodes formed on said first gate insulating layer at intervals;

a second gate insulating layer deposited so as to cover upper surfaces of said plurality of sub-electrodes, and filling gaps between said plurality of sub-serial electrodes for isolating said plurality of sub-electrodes from one another; and a control gate electrode formed on said second gate insulating layer, for creating an electric field across said first gate insulating layer so as to cause said tunneling current to flow through said first gate insulating layer and check a threshold whether higher or lower than a read-out gate voltage applied to said control gate electrode, said plurality of sub-electrodes having a first sub-electrode forming a first floating gate sub-transistor together with said first rate insulating layer, said second gate insulating layer, said control crate electrode and a first channel sub-region contiguous to said source region, and further having a second sub-electrode forming a second floating crate sub-transistor together with said first gate insulating layer, said second gate insulating layer, said control gate electrode and a second channel sub-region contiguous to said drain region, said first floating gate sub-transistor changing a first threshold between a first level and a second level both lower than said read-out gate voltage applied to said control rate electrode in a read-out operation, said second floating gate sub-transistor changing a second threshold between a third level and a fourth level across said read-out gate voltage.

2. The floating gate type field effect transistor as set forth in claim 1, in which said source region and said semiconductor layer form a p-n junction deeper than a p-n junction between said drain region and said semiconductor layer.

3. The floating gate type field effect transistor as set forth in claim 1, in which said source region and said drain region are partially overlapped with said floating gate electrode on said first gate insulating layer.

4. The floating gate type field effect transistor as set forth in claim 1, in which said plurality of sub-electrodes are two-dimensionally arranged on said first gate insulating layer.

5. The floating gate type field effect transistor as set forth in claim 4, in which said plurality of sub-electrodes two-dimensionally arranged are formed from silicon crystal grains, respectively.

6. The floating gate type field effect transistor as set forth in claim 1, in which said tunneling current flows from said plurality of sub-electrodes through said first gate insulating layer into said channel region.

7. The floating gate type field effect transistor as set forth in claim 1, said floating gate type field effect transistor forms a NOR type memory cell block together with other floating gate type field effect transistors each similar in structure thereto.

8. An over-erase resistant floating gate type field effect transistor fabricated on a semiconductor layer of a first conductivity type, comprising:

a source region having a second conductivity type opposite to said first conductivity type, and formed in a surface portion of said semiconductor layer so as to form a first p-n junction;

a drain region of said second conductivity type formed in another surface portion of said semiconductor layer spaced from said surface portion so as to form a second p-n junction shallower than said first p-n junction;

a channel region provided in yet another surface portion of said semiconductor layer between said source region and said drain region;

a first gate insulating layer covering said channel region an inner portion of said source region and an inner portion of said drain region, and have a thickness allowing a tunneling current to pass therethrough;

a floating gate electrode having a first sub-electrode formed on said first gate insulating layer and overlying said inner portion of said source region and a second sub-electrode formed on said first gate insulating layer and overlying said inner portion of said drain region, said first sub-electrode being spaced from said second sub-electrode;

a second gate insulating layer covering upper surfaces of said first and second sub-electrodes, and filling a gap between said first sub-electrode and said second sub-electrode for providing an electric isolation therebetween; and a control gate electrode formed on said second gate insulating layer, and creating an electric field across said first gate insulating layer so as to cause said tunneling current to flow from said first and second sub-electrodes through said first gate insulating layer and check said threshold whether higher or lower than a read-out gate voltage applied to said control gate electrode, said first gate insulating layer, said first sub-electrode, said second gate insulating layer, said control gate electrode and a first channel sub-region under said first sub-electrode forming in combination a first floating gate sub-transistor having a first threshold changed between a first level and a second level both lower than a read-out gate voltage applied to said control gate electrode, said first gate insulating layer, said second sub-electrode, said second gate insulating layer, said control gate electrode and a second channel sub-region under said second sub-electrode forming in combination a second floating gate sub-transistor having a second threshold changed between a third level lower than said read-out gate voltage and a fourth level both higher than said read-out gate voltage.

9. An over-erase resistant floating gate type field effect transistor fabricated on a semiconductor layer of a first conductivity type, comprising:

a source region having a second conductivity type opposite to said first conductivity type, and formed in a surface portion of said semiconductor layer so as to form a first p-n junction;

a drain region of said second conductivity type formed in another surface portion of said semiconductor layer spaced from said surface portion so as to form a second p-n junction shallower than said first p-n junction;

a channel region provided in yet another surface portion of said semiconductor layer between said source region and said drain region;

a first gate insulating layer covering said channel region an inner portion of said source region and an inner portion of said drain region, and have a thickness allowing a tunneling current to pass therethrough;

a floating gate electrode having a plurality of sub-electrodes two-dimensionally arranged over said first gate insulating layer and formed from silicon grains, respectively, said plurality of sub-electrodes being spaced from one another;

a second gate insulating layer covering upper surfaces of said first and second sub-electrodes, and filling gaps among said plurality of sub-electrodes for providing an electric isolation; and a control gate electrode formed on said second gate insulating layer, and creating an electric field across said first gate insulating layer so as to cause said tunneling current to flow from said plurality of sub-electrodes through said first gate insulating layer into said channel region and check said threshold whether higher or lower than a read-out gate voltage applied to said control gate electrode.

10. An over-erase resistant NOR type flash memory device comprising a stacked type memory cell changed to a write-in state through an injection of hot carrier and to an erased state by using a Fowler-Nordheim tunneling current, said stacked type memory cell comprising:

an n-type source region and an n-type drain region formed in a p-type silicon substrate, said n-type drain region generating said hot carrier;

a channel region formed in a surface of said p-type silicon substrate between an end portion of said n-type source region and an end portion of said n-type drain region, said Fowler-Nordheim tunneling current flowing into said channel region; and a stacked gate structure including
  a tunnel insulating layer covering said end portion of said n-type source region, said channel region and said end portion of said n-type drain region,
  a floating gate electrode provided on said tunnel insulating layer and formed by a single layer of n-type polysilicon split into a plurality of floating sub-electrodes, none of said floating sub-electrodes occupying over both of said end portions,
  an inter-gate insulating layer covering said floating gate electrode and electrically isolating said plurality of floating sub-electrodes from one another, and
  a control gate electrode provided on said inter-gate insulating layer.

* * * * *